US 9,768,791 B2

(12) United States Patent
Chindo

(10) Patent No.: US 9,768,791 B2
(45) Date of Patent: *Sep. 19, 2017

(54) QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventor: Koji Chindo, Suwa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/235,567

(22) Filed: Aug. 12, 2016

(65) Prior Publication Data

US 2016/0352346 A1 Dec. 1, 2016

Related U.S. Application Data

(63) Continuation of application No. 14/573,467, filed on Dec. 17, 2014, now Pat. No. 9,444,477.

(30) Foreign Application Priority Data

Dec. 20, 2013 (JP) .................................. 2013-263484

(51) Int. Cl.
*H03L 7/26* (2006.01)
*G04F 5/14* (2006.01)

(52) U.S. Cl.
CPC . *H03L 7/26* (2013.01); *G04F 5/14* (2013.01)

(58) Field of Classification Search
CPC ....................................................... H03L 7/26
USPC ....................................................... 331/94.1
See application file for complete search history.

(56) References Cited

U.S. PATENT DOCUMENTS

| 5,517,157 A | 5/1996 | English |
| 5,670,914 A | 9/1997 | Liberman et al. |
| 9,444,477 B2 * | 9/2016 | Chindo ..................... H03L 7/26 |
| 2009/0302956 A1 | 12/2009 | Matsuura |

FOREIGN PATENT DOCUMENTS

| JP | 59-178783 | 10/1984 |
| JP | 60-041275 | 3/1985 |
| JP | 63-260225 | 10/1988 |
| JP | 07-030420 | 1/1995 |
| JP | 07-045886 | 2/1995 |
| JP | 2000-004095 A | 1/2000 |
| JP | 2009-164331 A | 7/2009 |
| JP | 2009-302118 A | 12/2009 |
| JP | 2010-287937 A | 12/2010 |

* cited by examiner

*Primary Examiner* — Joseph Chang
(74) *Attorney, Agent, or Firm* — Harness, Dickey & Pierce, P.L.C.

(57) ABSTRACT

An atomic oscillator includes a gas cell into which alkali metal atoms are sealed, a light emitting portion that emits excitation light including a pair of resonance light beams for resonating the alkali metal atoms toward the alkali metal atoms, a coil that is provided to surround an outer circumference of the gas cell with an axis of the excitation light as an axial direction, and a shield case that stores at least the gas cell and the coil and contains a metal material, in which the shield case is constituted by a plurality of tabular portions, and, among the plurality of tabular portions, a main surface of one of two adjacent tabular portions faces a side surface of the other tabular portion.

21 Claims, 17 Drawing Sheets

QUANTUM INTERFERENCE DEVICE, ATOMIC OSCILLATOR, ELECTRONIC APPARATUS, AND MOVING OBJECT

CROSS-REFERENCE TO RELATED APPLICATIONS

This application is a continuation of U.S. patent application Ser. No. 14/573,467 filed Dec. 17, 2014, which claims priority to Japanese Patent Application No. 2013-263484 filed Dec. 20, 2013, both of which are hereby expressly incorporated by reference herein in their entireties.

BACKGROUND

1. Technical Field

The present invention relates to a quantum interference device, an atomic oscillator, an electronic apparatus, and a moving object.

2. Related Art

As for an oscillator which has a high accuracy oscillation characteristic for a long period of time, an atomic oscillator is known which oscillates on the basis of energy transition of atoms of an alkali metal such as rubidium or cesium (for example, refer to JP-A-2009-164331).

Generally, operation principles of the atomic oscillator are largely classified into a method of using a double resonance phenomenon caused by light and microwaves, and a method of using a quantum interference effect (also referred to as coherent population trapping (CPT)) caused by two types of light beams with different wavelengths. Anatomic oscillator using the quantum interference effect can be made smaller-sized than an atomic oscillator using the double resonance phenomenon, and thus has been recently expected to be mounted in various apparatuses.

The atomic oscillator using the quantum interference effect, as disclosed in JP-A-2009-164331, includes a gas cell into which gaseous metal atoms are sealed; a semiconductor laser which irradiates the metal atoms in the gas cell with laser light including two types of resonance light beams having different frequencies; and a light detector which detects the laser light which has been transmitted through the gas cell. In such an atomic oscillator, when a frequency difference between the two types of resonance light beams matches a specific value, neither of the two types of resonance light beams is absorbed by the metal atoms in the gas cell and are transmitted. This is called an electromagnetically induced transparency (EIT) phenomenon, and an EIT signal which rapidly increases due to the EIT phenomenon is detected by the light detector.

Here, from the viewpoint of increasing detection accuracy of the light detector, the EIT signal preferably has a small line width (half width). Therefore, a coil which generates a magnetic field in a direction along an optical axis of laser light is provided in the gas cell. By providing the coil, gaps between degenerated other energy levels of the atoms of the alkali metal in the gas cell are enlarged by the Zeeman splitting, and thus resolution can be improved. Therefore, it is possible to reduce a line width of the EIT signal.

In order to improve stability of a magnetic field in the gas cell, the gas cell and the coil are stored in a shield case (for example, refer to JP-A-2010-287937 and JP-A-2009-302118). JP-A-2010-287937 does not disclose a specific method of forming the shield case. On the other hand, JP-A-2009-302118 discloses that the shield case is formed by folding a sheet metal. However, if the sheet metal is only folded, a thickness of the shield case cannot be sufficiently secured at a part where edges of the sheet metal are close to or come into contact with each other. For this reason, there is a problem in that a shield effect of the shield case decreases.

SUMMARY

An advantage of some aspects of the invention is to provide a quantum interference device and an atomic oscillator, which stabilize a magnetic field in an inner space of a gas cell so as to reduce a line width of an EIT signal, thereby realizing good frequency stability, and also to provide an electronic apparatus and a moving object, which include the quantum interference device and have high reliability.

The invention can be implemented as the following forms or application examples.

Application Example 1

This application example is directed to a quantum interference device including: a gas cell into which metal atoms are sealed; a light emitting portion that emits light including a pair of resonance light beams for resonating the metal atoms toward the metal atoms; a coil that is provided to surround an outer circumference of the gas cell; and a shield case that stores the gas cell and the coil and contains a metal material, in which the shield case is constituted by a plurality of tabular portions, and, among the plurality of tabular portions, a main surface of one of two adjacent tabular portions faces a side surface of the other tabular portion.

According to the quantum interference device according to this application example, since the shield case is used, it is possible to stabilize a magnetic field in an inner space of the gas cell so as to further reduce a line width of an EIT signal, thereby realizing good frequency stability.

Application Example 2

In the quantum interference device according to the application example, it is preferable that the main surface intersects an axial direction of the coil.

With this configuration, it is possible to further stabilize a magnetic field in an inner space of the gas cell so as to further reduce a line width of an EIT signal, thereby realizing better frequency stability.

Application Example 3

In the quantum interference device according to the application example, it is preferable that the plurality of tabular portions include five tabular portions.

With this configuration, it is possible to cover the gas cell and the coil with the simple configuration.

Application Example 4

In the quantum interference device according to the application example, it is preferable that the shield case includes the plurality of tabular portions which are obtained by folding a single plate.

With this configuration, it is possible to simplify a configuration of the shield case and to contribute to miniaturization thereof.

Application Example 5

In the quantum interference device according to the application example, it is preferable that the main surface is joined to the side surface at a part where the main surface faces the side surface.

With this configuration, it is possible to reliably prevent an external magnetic field from entering the shield case and thus to further stabilize a magnetic field in the inner space of the gas cell.

Application Example 6

In the quantum interference device according to the application example, it is preferable that the metal material includes a soft magnetic material.

With this configuration, it is possible to further improve a shield effect by the shield case.

Application Example 7

In the quantum interference device according to the application example, it is preferable that the soft magnetic material is permalloy.

With this configuration, it is possible to considerably improve a shield effect by the shield case.

Application Example 8

This application example is directed to an atomic oscillator including the quantum interference device according to the application example.

With this configuration, it is possible to provide an atomic oscillator which stabilizes a magnetic field in an inner space of the gas cell so as to reduce a line width of an EIT signal, thereby realizing good frequency stability.

Application Example 9

This application example is directed to an electronic apparatus including the quantum interference device according to the application example.

With this configuration, it is possible to provide an electronic apparatus with high reliability.

Application Example 10

This application example is directed to a moving object including the quantum interference device according to the application example.

With this configuration, it is possible to provide a moving object with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, with reference to the accompanying drawings, a detailed description will be made of a quantum interference device, an atomic oscillator, an electronic apparatus, and a moving object according to embodiments of the invention.

1. Atom Oscillator (Quantum Interference Device)

First, an atomic oscillator (an atomic oscillator including a quantum interference device according to an embodiment of the invention) according to an embodiment of the invention will be described. In addition, hereinafter, an example in which a quantum interference device according to an embodiment of the invention is applied to an atomic oscillator will be described, but the invention is not limited thereto, and the quantum interference device is applicable to, for example, a magnetic sensor and a quantum memory.

Figure 1:
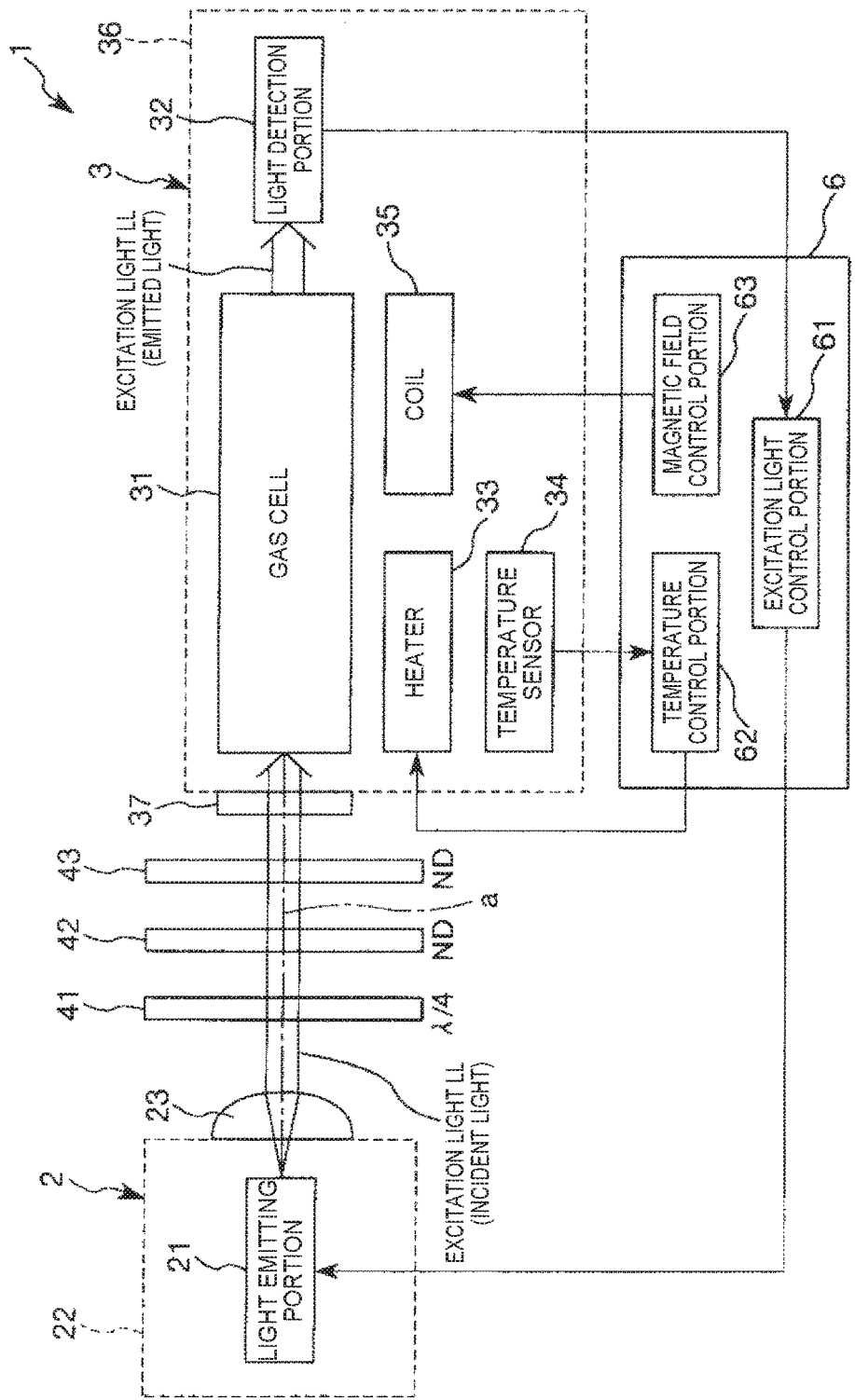
FIG. 1 is a schematic diagram illustrating a configuration of an atomic oscillator according to an embodiment of the invention.
Figure 2:
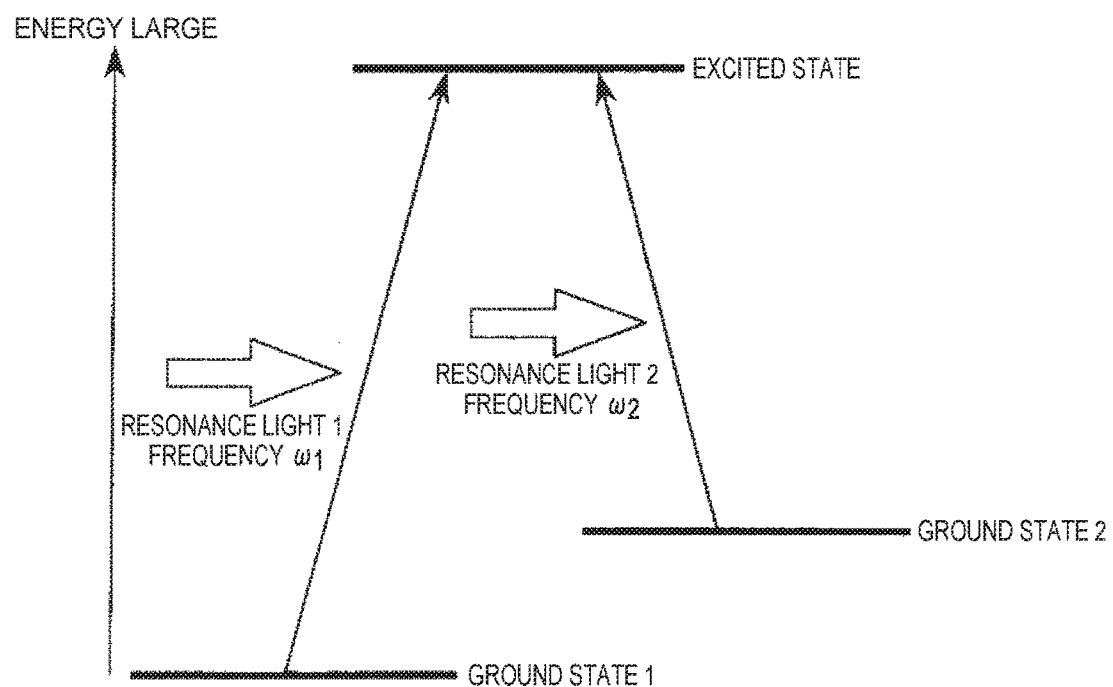
FIG. 2 is a diagram illustrating an energy state of an alkali metal.
Figure 3:
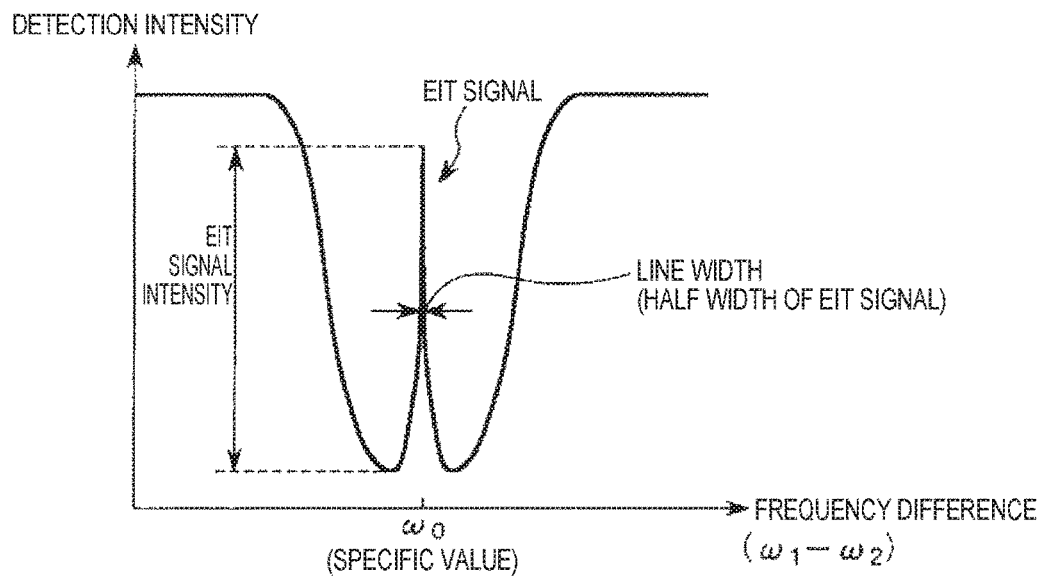
FIG. 3 is a graph illustrating a relationship between a frequency difference between two light beams emitted from a light emitting portion, and an intensity of light detected by a light detection portion.

FIG. 1 is a schematic diagram illustrating an atomic oscillator according to an embodiment of the invention. In addition, FIG. 2 is a diagram illustrating an energy state of an alkali metal, and FIG. 3 is a graph illustrating a relationship between a frequency difference between two light beams emitted from a light emitting portion, and an intensity of light detected by a light detection portion.

The atomic oscillator (quantum interference device) 1 illustrated in FIG. 1 uses a quantum interference effect.

The atomic oscillator 1, as illustrated in FIG. 1, includes a first unit 2 which is a unit of a light emission side, a second unit 3 which is a unit of a light detection side, optical components 41, 42 and 43 provided between the units 2 and 3, and a controller 6 which controls the first unit 2 and the second unit 3.

Here, the first unit 2 includes a light emitting portion 21 and a first package 22 which stores the light emitting portion 21.

The second unit 3 includes a gas cell 31, a light detection portion 32, a heater 33, a temperature sensor 34, a coil 35, and a second package 36 which stores the above-described elements. The gas cell 31 and the coil 35 are stored in a shield case 9.

First, a principle of the atomic oscillator 1 will be described briefly.

As illustrated in FIG. 1, in the atomic oscillator 1, the light emitting portion 21 emits excitation light LL toward the gas cell 31, and the light detection portion 32 detects the excitation light LL which has been transmitted through the gas cell 31.

A gaseous alkali metal (metal atoms) is sealed into the gas cell 31. The alkali metal has energy levels of a three-level system as illustrated in FIG. 2, and may take three states including two ground states (ground states 1 and 2) with different energy levels and an excited state. Here, the ground state 1 is an energy state lower than the ground state 2.

The excitation light LL emitted from the light emitting portion 21 includes two types of resonance light beams 1 and 2 which have different frequency. When the above-described gaseous alkali metal is irradiated with the two types of resonance light beams 1 and 2, light absorptance (light transmittance) of the resonance light beams 1 and 2 in the alkali metal varies depending on a difference ($\omega_1$-$\omega_2$) between a frequency $\omega_1$ of the resonance light 1 and a frequency $\omega_2$ of the resonance light 2.

When the difference ($\omega_1$-$\omega_2$) between the frequency $\omega_1$ of the resonance light 1 and the frequency $\omega_2$ of the resonance light 2 matches a frequency corresponding to an energy difference between the ground state 1 and the ground state 2, excitation from the ground states 1 and 2 to the excited state stops, respectively. At this time, neither of the resonance light beams 1 and 2 is absorbed by the alkali metal, but both are transmitted therethrough. This phenomenon is called a CPT phenomenon or an electromagnetically induced transparency (EIT) phenomenon.

For example, if the light emitting portion 21 fixes the frequency $\omega_1$ of the resonance light 1 to a certain value and changes the frequency $\omega_2$ of the resonance light 2, when the difference ($\omega_1$-$\omega_2$) between the frequency $\omega_1$ of the resonance light 1 and the frequency $\omega_2$ of the resonance light 2 matches a frequency $\omega_0$ corresponding to an energy difference between the ground state 1 and the ground state 2, an intensity detected by the light detection portion 32 rapidly increases as illustrated in FIG. 3. This rapidly increasing signal is detected as an EIT signal. The EIT signal has an inherent value which is defined by the kind of alkali metal. Therefore, an oscillator can be formed by using such an EIT signal.

Hereinafter, a specific configuration of the atomic oscillator 1 according to the present embodiment will be described.

Figure 4:
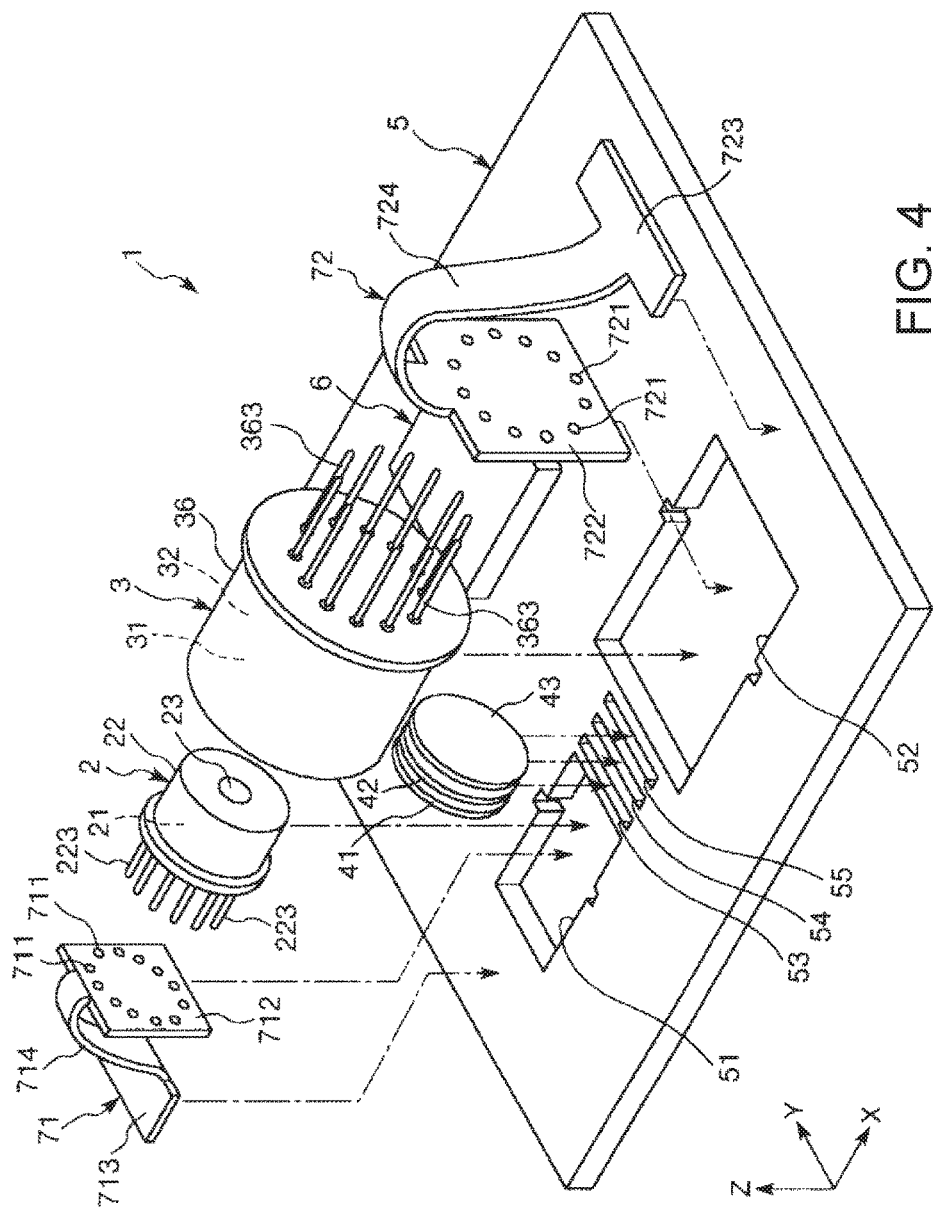
FIG. 4 is an exploded perspective view of the atomic oscillator illustrated in FIG. 1.
Figure 5:
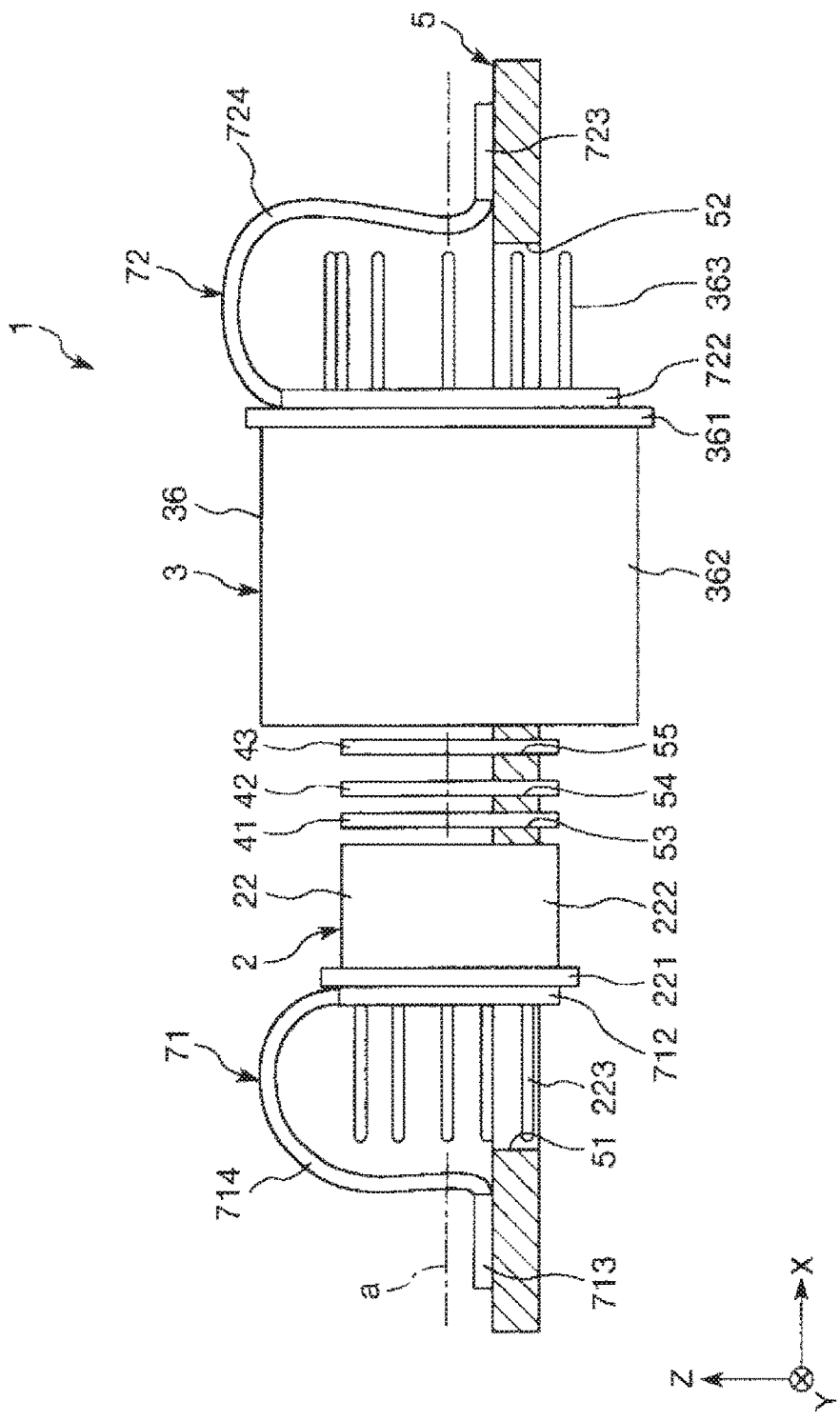
FIG. 5 is a longitudinal cross-sectional view of the atomic oscillator illustrated in FIG. 1.

FIG. 4 is an exploded perspective view of the atomic oscillator illustrated in FIG. 1, and FIG. 5 is a longitudinal cross-sectional view of the atomic oscillator illustrated in FIG. 1.

In addition, in FIGS. 4 and 5 (the same for FIGS. 7 and 8, and FIGS. 10 to 13, and FIG. 17), for convenience of description, an X axis, a Y axis, a Z axis are illustrated as three axes which are perpendicular to each other, and a tip end side of each arrow illustrated in each drawing is referred to as "+(positive) side", and a base end side is referred to as "−(negative) side". Further, hereinafter, for convenience of description, a direction parallel to the X axis is referred to as an "X axis direction", a direction parallel to the Y axis is referred to as a "Y axis direction", and a direction parallel to the Z axis is referred to as a "Z axis direction". In addition, a +Z direction side (a top side in each drawing) is referred to as an "upper side", and a −Z direction side (a bottom side in each drawing) is referred to as a "lower side".

The atomic oscillator 1, as illustrated in FIG. 4, includes a wiring board 5 (support member) in which the controller 6 is mounted and which holds the first unit 2, the second unit 3, and the optical components 41, 42 and 43, and connectors 71 and 72 which electrically connect the first unit 2 and the second unit 3 to the wiring board 5.

The first unit 2 and the second unit 3 are electrically connected to the controller 6 via a wiring (not illustrated) of the wiring board 5 and the connectors 71 and 72 and are controlled to be driven by the controller 6.

Hereinafter, each part of the atomic oscillator 1 will be described in order.

First Unit

As described above, the first unit 2 includes the light emitting portion 21 and the first package 22 which stores the light emitting portion 21.

Light Emitting Portion

The light emitting portion 21 has a function of emitting the excitation light LL for exciting alkali metal atoms in the gas cell 31.

More specifically, the light emitting portion 21 emits light including the above-described two types of light beams (the resonance light 1 and the resonance light 2) as the excitation light LL.

The frequency $\omega_1$ of the resonance light 1 can excite (resonate) the alkali metal in the gas cell 31 from the above-described ground state 1 to the excited state.

The frequency $\omega_2$ of the resonance light 2 can excite (resonate) the alkali metal in the gas cell 31 from the above-described ground state 2 to the excited state.

The light emitting portion 21 is not particularly limited as long as the above-described excitation light LL can be emitted, but, for example, a semiconductor laser such as a vertical cavity surface emitting laser (VCSEL) may be used.

In addition, a temperature of the light emitting portion 21 is adjusted to a predetermined temperature by a temperature adjustment element (a heating resistor, a Peltier element, or the like) (not illustrated).

First Package

The first package 22 stores the above-described light emitting portion 21.

As illustrated in FIG. 5, the first package 22 includes a base 221 (first base) and a lid 222 (first lid).

The base 221 directly or indirectly supports the light emitting portion 21. In the present embodiment, the base 221 is tabular, and is circular in a plan view.

The light emitting portion 21 (mounted component) is installed (mounted) on one surface (mounted surface) of the base 221. As illustrated in FIG. 5, a plurality of leads 223 protrude from the other surface of the base 221. The plurality of leads 223 are electrically connected to the light emitting portion 21 via a wiring (not illustrated).

The base 221 is joined to the lid 222 which covers the light emitting portion 21 on the base 221.

The lid 222 has a bottomed tubular shape of which one end is open. In the present embodiment, the tubular portion of the lid 222 is cylindrical.

The opening of one end of the lid 222 is closed by the base 221.

A window portion 23 is provided at the other end of the lid 222, that is, on a bottom opposite to the opening of the lid 222.

The window portion 23 is provided on an optical axis (an axis a of the excitation light LL) between the gas cell 31 and the light emitting portion 21.

The window portion 23 transmits the excitation light LL therethrough.

In the present embodiment, the window portion 23 is a lens. Consequently, the excitation light LL can be applied to the gas cell 31 without any waste.

The window portion 23 has a function of converting the excitation light LL into parallel light. That is, the window portion 23 is a collimator lens, and the excitation light LL in an inner space S is parallel light. Thus, it is possible to increase the number of alkali metal atoms which are resonated by the excitation light LL emitted from the light emitting portion 21, among the alkali metal atoms present in the inner space S. As a result, it is possible to increase an intensity of the EIT signal.

The window portion 23 is not limited to the lens as long as the excitation light LL can be transmitted therethrough, and may be, for example, optical components other than a lens, and may be a simple light-transmissive tabular member. In this case, the lens having the above-described function may be provided between the first package 22 and the second package 36 in the same manner as the optical components 41, 42 and 43 described later.

Materials forming the portions of the lid 222 other than the window portion 23 are not particularly limited, but, for example, ceramics, a metal, or a resin may be used.

Here, in a case where the portions of the lid 222 other than the window portion 23 are made of a material which transmits the excitation light therethrough, the portions of the lid 222 other than the window portion 23 may be integrally formed with the window portion 23. In addition, in a case where the portions of the lid 222 other than the window portion 23 are made of a material which does not transmit the excitation light therethrough, the portions of the lid 222 other than the window portion 23 may be formed separately from the window portion 23, and may be joined thereto by using well-known joint methods.

The base 221 and the lid 222 are preferably air-tightly joined to each other. In other words, a space in the first package 22 is preferably air-tightly formed. Consequently, the first package 22 can be made in a decompressed state or in an inert gas sealed state, and, as a result, it is possible to improve characteristics of the atomic oscillator 1.

A joint method of the base 221 and the lid 222 is not particularly limited, but, for example, brazing, seam welding, or energy ray welding (laser welding, electron ray welding, or the like) may be used.

A joint member for joining the base 221 to the lid 222 may be interposed therebetween.

Components other than the light emitting portion 21 may be stored in the first package 22.

For example, a temperature adjustment element which adjusts a temperature of the light emitting portion 21 or a temperature sensor may be stored in the first package 22. As such a temperature adjustment element, for example, there may be a heating resistor (heater) or a Peltier element.

According to the first package 22 configured to include the base 221 and the lid 222, the first package 22 can store the light emitting portion 21 while allowing the excitation light from the light emitting portion 21 to be emitted to the outside of the first package 22.

The first package 22 is held at the wiring board 5, described later, so that the base 221 is disposed on an opposite side to the second package 36.

Second Unit

As described above, the second unit 3 includes the gas cell 31, the light detection portion 32, the heater 33, the temperature sensor 34, the coil 35, and the second package 36 which stores the above-described elements. In addition, as described above, the gas cell 31 and the coil 35 are stored in the shield case 9.

Gas Cell

An alkali metal such as gaseous rubidium, cesium or sodium is sealed into the gas cell 31. A rare gas such as argon or neon, or an inert gas such as nitrogen may be sealed as a buffer gas in the gas cell 31 along with the alkali metal gas as necessary.

Figure 6:
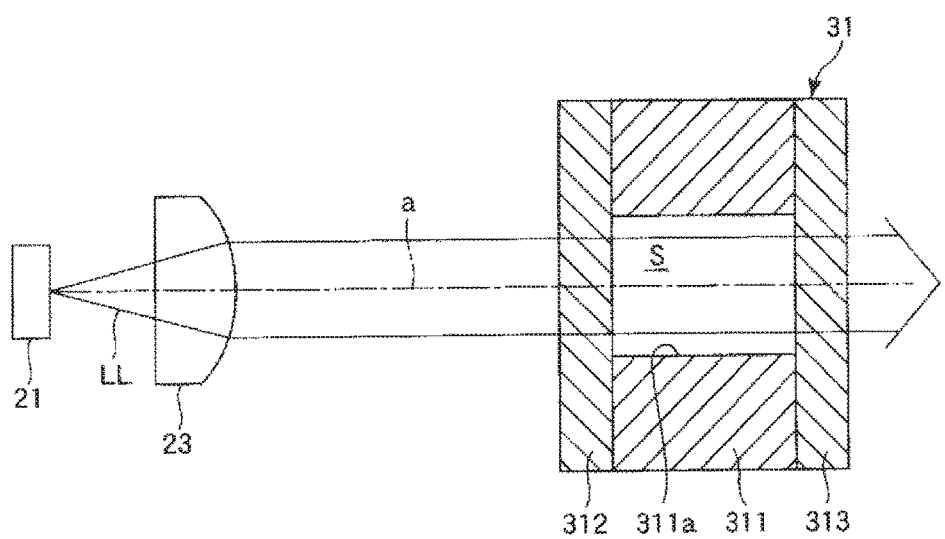
FIG. 6 is a schematic diagram illustrating a light emission portion and a gas cell included in the atomic oscillator illustrated in FIG. 1.

For example, as illustrated in FIG. 6, the gas cell 31 includes a main body 311 which has a columnar through hole 311a, and a pair of windows 312 and 313 which seal both openings of the through hole 311a. Thus, the inner space S in which the above-described alkali metal is sealed is formed.

A material forming the main body 311 is not particularly limited, but, for example, a metal material, a resin material, a glass material, a silicon material, quartz crystal, or the like may be used. From the viewpoint of workability or joining with the windows 312 and 313, the glass material or the silicon material is preferably used.

The main body 311 is air-tightly joined to the windows 312 and 313. Consequently, the inner space S of the gas cell 31 can be formed as an air-tight space.

A method of joining the main body 311 to the windows 312 and 313 is not particularly limited as long as the method is defined according to a forming material, but, for example, a joint method using an adhesive, a direct joint method, and an anodic joint method may be used.

A material forming the windows 312 and 313 is not particularly limited as long as the material can transmit the excitation light LL therethrough, but, for example, a silicon material, a glass material, or quartz crystal may be used.

The windows 312 and 313 transmit the excitation light LL from the light emitting portion 21 therethrough. One window 312 transmits the excitation light LL which is incident to the gas cell 31 therethrough, and the other window 313 transmits the excitation light LL which is emitted out of the gas cell 31 therethrough.

The gas cell 31 is heated by the heater 33 so as to be adjusted to a predetermined temperature.

Light Detection Portion

The light detection portion 32 has a function of detecting an intensity of the excitation light LL (the resonance light beams 1 and 2) which has been transmitted through the gas cell 31.

The light detection portion 32 is not particularly limited as long as the excitation light can be detected, but, for example, a light detector (light receiving element) such as a solar cell or a photodiode may be used.

Heater

The heater 33 has a function of heating the above-described gas cell 31 (more specifically, the alkali metal in the gas cell 31). Thus, the alkali metal in the gas cell 31 can be maintained in a gaseous phase of a desired concentration.

The heater 33 generates heat due to conduction, and is formed by, for example, a heating resistor provided on an outer surface of the gas cell 31. This heating resistor is formed by using, for example, a chemical vapor deposition method (CVD) such as plasma CVD or thermal CVD, a dry plating method such as vacuum deposition, or a sol/gel method.

Here, in a case where the heating resistor is provided at an incidence portion or an emission portion of the excitation light LL in the gas cell 31, the heating resistor is made of a material which transmits the excitation light therethrough, specifically, a transparent electrode material such as an oxide, for example, indium tin oxide (ITO), indium zinc oxide (IZO), $In_2O_3$, $SnO_2$, Sb-containing $SnO_2$, or Al-containing ZnO.

The heater 33 is not particularly limited as long as the gas cell 31 can be heated, and may not be in contact with the gas cell 31. In addition, the gas cell 31 may be heated by using a Peltier element instead of the heater 33 or along with the heater 33.

The heater 33 is electrically connected to a temperature control portion 62 of the controller 6, described later, so as to be conducted.

Temperature Sensor

The temperature sensor 34 detects a temperature of the heater 33 or the gas cell 31. In addition, a heating amount of the above-described heater 33 is controlled on the basis of a detection result from the temperature sensor 34. Thus, the alkali metal atoms in the gas cell 31 can be maintained at a desired temperature.

In addition, a position where the temperature sensor 34 is installed is not particularly limited, and, for example, the temperature sensor 34 may be installed on the heater 33, and may be installed on the outer surface of the gas cell 31.

The temperature sensor 34 is not particularly limited, and well-known temperature sensors such as a thermistor and a thermocouple may be used.

The temperature sensor 34 is electrically connected to the temperature control unit 62 of the controller 6, described later, via a wiring (not illustrated).

Coil

The coil 35 has a function of generating a magnetic field in the direction (parallel direction) along the axis a of the excitation light LL in the inner space S. Thus, gaps between degenerated other energy levels of the alkali metal atoms in the inner space S are enlarged by the Zeeman splitting, and thus resolution can be improved. As a result, it is possible to reduce a line width of the EIT signal.

A magnetic field generated by the coil 35 may be either a DC magnetic field or an AC magnetic field, and a magnetic field is obtained when a DC magnetic field overlaps an AC magnetic field.

An installation position of the coil 35 is not particularly limited. For example, a pair of coils may oppose each other with the gas cell 31 interposed therebetween so as to form Helmholtz coils, but, in the present embodiment, the coil 35 is wound along an outer circumference of the gas cell 31 so as to form a solenoid coil. This configuration will be described later in detail.

The coil 35 is electrically connected to a magnetic field control portion 63 of the controller 6, described later, via a wiring (not illustrated). Thus, the coil 35 can be conducted.

Second Package

The second package 36 stores the gas cell 31, the light detection portion 32, the heater 33, the temperature sensor 34, and the coil 35.

The second package 36 is formed in the same manner as the first package 22 of the first unit 2.

Specifically, as illustrated in FIG. 5, the second package 36 includes a base 361 (second base) and a lid 362 (second lid).

The base 361 directly or indirectly supports the gas cell 31, the light detection portion 32, the heater 33, the temperature sensor 34, and the coil 35. In the present embodiment, the base 361 is tabular, and is circular in a plan view.

The gas cell 31, the light detection portion 32, the heater 33, the temperature sensor 34, and the coil 35 (a plurality of mounted components) are installed (mounted) on one surface of the base 361. As illustrated in FIG. 5, a plurality of leads 363 protrude from the other surface of the base 361. The plurality of leads 363 are electrically connected to the light detection portion 32, the heater 33, the temperature sensor 34, and the coil 35 via wirings (not illustrated).

The base 361 is joined to a lid 362 which covers the gas cell 31, the light detection portion 32, the heater 33, the temperature sensor 34, and the coil 35 on the base 361.

The lid 362 has a bottomed tubular shape of which one end is open. In the present embodiment, the tubular portion of the lid 362 is cylindrical.

The opening of one end of the lid 362 is closed by the base 361.

A window portion 37 is provided at the other end of the lid 362, that is, on a bottom opposite to the opening of the lid 362.

The window portion 37 is provided on the optical axis (the axis a) between the gas cell 31 and the light emitting portion 21.

The window portion 37 transmits the above-described excitation light therethrough.

In the present embodiment, the window portion 37 is made of a light-transmissive tabular member.

The window portion 37 is not limited to the light-transmissive tabular member as long as the excitation light can be transmitted therethrough, and may be, for example, an optical component such as a lens, a polarization plate, or a λ/4 wavelength plate.

Materials forming the portions of the lid 362 other than the window portion 37 are not particularly limited, but, for example, ceramics, a metal, or a resin may be used.

Here, in a case where the portions of the lid 362 other than the window portion 37 are made of a material which transmits the excitation light therethrough, the portions of the lid 362 other than the window portion 37 may be integrally formed with the window portion 37. In addition, in a case where the portions of the lid 362 other than the window portion 37 are made of a material which does not transmit the excitation light therethrough, the portions of the lid 362 other than the window portion 37 may be formed separately from the window portion 37, and may be joined thereto by using well-known joint methods.

The base 361 and the lid 362 are preferably air-tightly joined to each other. In other words, a space in the second package 36 is preferably air-tightly formed. Consequently, the second package 36 can be made in a decompressed state or in an inert gas sealed state, and, as a result, it is possible to improve characteristics of the atomic oscillator 1.

A joint method of the base 361 and the lid 362 is not particularly limited, but, for example, brazing, seam welding, or energy ray welding (laser welding, electron ray welding, or the like) may be used.

A joint member for joining the base 361 to the lid 362 may be interposed therebetween.

At least the gas cell 31, the light detection portion 32, and the coil 35 may be stored in the second package 36, and components other than the gas cell 31, the light detection portion 32, the heater 33, the temperature sensor 34, and the coil 35 may be stored therein.

According to the second package 36 configured to include the base 361 and the lid 362, the second package 36 can store the gas cell 31, the light detection portion 32, and the coil 35 while allowing the excitation light from the light emitting portion 21 to be incident to the second package 36. Therefore, the second package 36 is used in combination with the first package 22, and thus it is possible to store the light emitting portion 21 and the gas cell 31 in the different packages which are not in contact with each other while securing the optical path of the excitation light from the light emitting portion 21 to the light detection portion 32 via the gas cell 31.

The second package 36 is held at the wiring board 5, described later, so that the base 361 is disposed on an opposite side to the first package 22.

Optical Components

The plurality of optical components 41, 42 and 43 are provided between the first package 22 and the second package 36. The plurality of optical components 41, 42 and 43 are provided on the optical axis (the axis a) between the light emitting portion 21 in the first package 22 and the gas cell 31 in the second package 36.

Here, in the present embodiment, the optical component 41, the optical component 42, and the optical component 43 are disposed in this order from the first package 22 side to the second package 36 side.

The optical component 41 is a λ/4 wavelength plate. Thus, for example, in a case where excitation light from the light emitting portion 21 is linearly polarized light, the excitation light can be converted into circularly polarized light (right-handed circularly polarized light or left-handed circularly polarized light).

As described above, in a state in which the alkali metal atoms in the gas cell 31 are Zeeman-split by a magnetic field of the coil 35, if linearly polarized excitation light is applied to the alkali metal atoms, the alkali metal atoms are uniformly distributed to and are present in a plurality of levels in which the alkali metal atoms are Zeeman-split due to an interaction between the excitation light and the alkali metal atoms. As a result, since the number of alkali metal atoms with a desired energy level becomes relatively smaller than the number of alkali metal atoms with other energy levels, the number of atoms showing a desired EIT phenomenon is reduced, thus an intensity of a desired EIT signal decreases, and, as a result, an oscillation characteristic of the atomic oscillator 1 deteriorates.

In contrast, as described above, in a state in which the alkali metal atoms in the gas cell 31 are Zeeman-split by a magnetic field of the coil 35, if circularly polarized excitation light is applied to the alkali metal atoms, due to an interaction between the excitation light and the alkali metal atoms the number of alkali metal atoms with a desired energy level can be made relatively larger than the number of alkali metal atoms with other energy levels among a plurality of levels in which the alkali metal atoms are Zeeman-split. For this reason, the number of atoms showing a desired EIT phenomenon increases, thus an intensity of a desired EIT signal also increases, and, as a result, an oscillation characteristic of the atomic oscillator 1 can be improved.

In the present embodiment, the optical component 41 has a disc shape. For this reason, the optical component 41 can be rotated about an axial line which is parallel to the optical axis (the axis a) in a state of being engaged with a through hole 53 having a shape, described later. A shape of the optical component 41 in a plan view is not limited thereto, and may be a polygonal shape such as a quadrangular or pentagonal shape.

The optical components 42 and 43 are disposed on the second unit 3 side so as to correspond to the optical component 41.

The optical components 42 and 43 are dimming filters (ND filters). Thus, an intensity of the excitation light LL which is incident to the gas cell 31 can be adjusted (reduced). For this reason, even in a case where an output level of the light emitting portion 21 is high, the excitation light incident to the gas cell 31 can be adjusted to a desired light amount. In the present embodiment, an intensity of the excitation light LL which has been converted into circularly polarized light by the optical component 41 is adjusted by the optical components 42 and 43.

In the present embodiment, each of the optical components 42 and 43 is tabular. A shape of each of the optical components 42 and 43 in a plan view is circular. For this reason, each of the optical components 42 and 43 can be rotated about an axial line which is parallel to the optical axis (the axis a) in a state of being engaged with the through hole 53 having a shape, described later.

A shape of each of the optical components 42 and 43 in a plan view is not limited thereto, and may be a polygonal shape such as a quadrangular or pentagonal shape.

Dimming rates of the optical component 42 and the optical component 43 may or may not be the same as each other.

The optical components 42 and 43 may have portions of which dimming rates are different continuously or stepwise on the upper sides and the lower sides. In this case, positions of the optical components 42 and 43 are adjusted vertically with respect to the wiring board 5, and thus a dimming rate of the excitation light can be adjusted.

Each of the optical components 42 and 43 may have a portion of which a dimming rate is different continuously or intermittently in a circumferential direction. In this case, the optical components 42 and 43 are rotated, and thus a dimming rate of the excitation light can be adjusted. In addition, in this case, a rotation center of the optical components 42 and 43 may be deviated from the axis a.

One of the optical components 42 and 43 may be omitted. In a case where an output level of the light emitting portion 21 is appropriate, both of the optical components 42 and 43 may be omitted.

The optical components 41, 42 and 43 are not limited to the types, the arrangement order, the number thereof described above, and the like. For example, the optical components 41, 42 and 43 are not limited to the λ/4 wavelength plate or the dimming filter, respectively, and may be lenses, polarization plates, or the like.

Wiring Board

The wiring board 5 has wires (not illustrated), and has a function of electrically connecting electronic components such as the controller 6 mounted on the wiring board 5 to the connectors 71 and 72 via the wires.

The wiring board 5 has a function of holding the first package 22, the second package 36, and the plurality of optical components 41, 42 and 43.

The wiring board 5 holds the first package 22 and the second package 36 which are not in contact with each other with a space interposed therebetween. Consequently, thermal interference between the light emitting portion 21 and the gas cell 31 is prevented or minimized, and thus temperatures of the light emitting portion 21 and the gas cell 31 can be controlled independently from each other.

Specifically, as illustrated in FIG. 4, the wiring board 5 is provided with through holes 51, 52, 53, 54 and 55 which penetrate in a thickness direction thereof.

Here, the through hole 51 (first through hole) is provided on one end side of the wiring board 5 in the X axis direction, and the through hole 52 (second through hole) is provided on the other end side of the wiring board 5 in the X axis direction. The through holes 53, 54 and 55 (third through holes) are provided between the through hole 51 and the through hole 52 of the wiring board 5.

In the present embodiment, the through holes 51, 52, 53, 54, 55 are formed independently from each other. For this reason, it is possible to increase rigidity of the wiring board 5.

Part of the first package 22 is inserted into the through hole 51 from the upper side, and thus the first package 22 is positioned in the X axis direction, the Y axis direction, and the Z axis direction with respect to the wiring board 5.

In the present embodiment, a width of the through hole 51 in the Y axis direction is smaller than a width (a diameter of the cylindrical portion) of the first package 22 in the Y axis direction. For this reason, the first package 22 is engaged (in contact) with an edge of the through hole 51 in a state in which the central axis of the cylindrical portion is located above the wiring board 5.

If the first package 22 is in contact with the edge of the through hole 51, a contact area between the first package 22 and the wiring board 5 can be reduced. Consequently, it is possible to minimize transmission of heat between the first package 22 and the wiring board 5.

Similarly, part of the second package 36 is inserted into the through hole 52 from the upper side, and thus the second package 36 is positioned in the X axis direction, the Y axis direction, and the Z axis direction with respect to the wiring board 5. In the same manner as in the first package 22, the second package 36 is in contact with the edge of the through hole 52, and thus a contact area between the second package 36 and the wiring board 5 can be reduced. Consequently, it is possible to minimize transmission of heat between the second package 36 and the wiring board 5.

As mentioned above, it is possible to minimize heat transmission between the first package 22 and the second package 36 through the wiring board 5 and thus to minimize thermal interference between the light emitting portion 21 and the gas cell 31.

According to the wiring board 5 provided with such through holes 51 and 52, the first package 22 and the second package 36 are installed at the wiring board 5, and thus an optical system including the light emitting portion 21 and the light detection portion 32 can be positioned. For this reason, the first package 22 and the second package 36 can be easily installed at the wiring board 5.

When compared with a case where members holding the first package 22 and the second package 36 are provided separately from the wiring pattern 5, it is possible to reduce the number of components. As a result, it is possible to achieve low cost and miniaturization of the atomic oscillator 1.

In the present embodiment, as described above, since the through hole 51 into which the first package 22 is inserted and the through hole 52 into which the second package 36 is inserted are formed separately from each other at the wiring board 5, it is possible to increase the rigidity of the wiring board 5 and also to hold the first package 22 and the second package 36 at the wiring board 5.

Part of the optical component 41 is inserted into the through hole 53, and thus the optical component 41 is positioned in the X axis direction, the Y axis direction, and the Z axis direction with respect to the wiring board 5.

Similarly, part of the optical component 42 is inserted into the through hole 54, and thus the optical component 42 is positioned in the X axis direction, the Y axis direction, and the Z axis direction with respect to the wiring board 5.

In addition, part of the optical component 43 is inserted into the through hole 55, and thus the optical component 43 is positioned in the X axis direction, the Y axis direction, and the Z axis direction with respect to the wiring board 5.

According to the wiring board 5 having the through holes 53, 54 and 55, since the optical components 41, 42 and 43 are held thereat, the optical components 41, 42 and 43 can be installed in the wiring board while adjusting positions or attitudes thereof, in a state in which the first package 22 and the second package 36 are held at the wiring board 5, when each component is installed in the wiring board 5 during manufacturing of the atomic oscillator 1.

The through hole 53 can hold the optical component 41 to be rotated about an axial line (for example, the axis a) along a line segment which connects the first package 22 to the second package 36. Therefore, an attitude of the optical component 41 about the axis a can be adjusted in a state in which the optical component 41 is engaged with the through hole 53 of the wiring board 5 and is thus positioned in a direction parallel to the axis a.

Similarly, the through hole 54 can hold the optical component 42 to be rotated about an axial line along the line segment which connects the first package 22 to the second package 36. In addition, the through hole 55 can hold the optical component 43 to be rotated about an axial line along the line segment which connects the first package 22 to the second package 36.

In the present embodiment, the through holes 53, 54 and 55 are formed so that plate surfaces of the optical components 41, 42 and 43 are parallel to each other. In addition, the through holes 53, 54 and 55 are formed so that each of the plate surfaces of the optical components 41, 42 and 43 is perpendicular to the axis a. The through holes 53, 54 and 55 may be formed so that the plate surfaces of the optical components 41, 42 and 43 are not parallel to each other, and may be formed so that each of the plate surfaces of the optical components 41, 42 and 43 is tilted with respect to the axis a.

Here, as described above, since the optical component 41 is a λ/4 wavelength plate, an attitude of the optical component 41 is adjusted by rotating the optical component 41 regardless of an attitude of the first package 22 relative to the wiring board 5, and thus the excitation light from the light emitting portion 21 can be converted from linearly polarized light into circularly polarized light.

When the optical components 41, 42 and 43 are installed in the wiring board 5, first, for example, the first unit 2 and the second unit 3 are installed in and fixed to the wiring board 5. Then, at least one of positions and attitudes of the optical components 41, 42 and 43 are changed while checking an EIT signal in a state in which the optical components 41, 42 and 43 are respectively engaged with the corresponding through holes 53, 54 and 55. When a desired EIT signal is confirmed, the optical components 41, 42 and 43 are fixed to the wiring board 5 in this state. This fixation is not particularly limited, but may be performed by using, for example, a light curable adhesive. Even if the light curable adhesive is supplied to each of the through holes 53, 54 and 55 before being cured, positions or attitudes of each of the optical components 41, 42 and 43 can be changed, and thus the light curable adhesive can be cured at a desired time in a short period of time in order to fix the through holes to the wiring board 5.

Various print wiring boards may be used as the wiring board 5, but, as described above, a board having a rigid portion, for example, a rigid board or a flexible rigid board is preferably used from the viewpoint of ensuring the rigidity which is required to maintain a positional relationship between the held first package 22, second package 36, and optical components 41, 42 and 43.

Even in a case where a wiring board (for example, a flexible board) not having a rigid portion is used as the wiring board 5, for example, a reinforcing member for improving rigidity is joined to the wiring board, and thus it is possible to maintain a positional relationship between the first package 22, the second package 36, and the optical components 41, 42 and 43.

The controller 6 and the connectors 71 and 72 are installed on one surface of the wiring board 5. Electronic components other than the controller 6 may be mounted on the wiring board 5.

Controller

The controller 6 illustrated in FIG. 1 has a function of controlling each of the heater 33, the coil 35, and the light emitting portion 21.

In the present embodiment, the controller 6 is constituted by an integrated circuit (IC) chip mounted on the wiring board 5.

The controller 6 includes the excitation light control portion 61 which controls frequencies of the resonance light beams 1 and 2 from the light emitting portion 21, the temperature control portion 62 which controls a temperature of the alkali metal in the gas cell 31, and the magnetic field control portion 63 which controls a magnetic field applied to the gas cell 31.

The excitation light control portion 61 controls frequencies of the resonance light beams 1 and 2 which are emitted from the light emitting portion 21 on the basis of a detection result from the above-described light detection portion 32. More specifically, the excitation light control portion 61 controls frequencies of the resonance light beams 1 and 2 emitted from the light emitting portion 21 so that the frequency difference ($\omega_1-\omega_2$) detected by the light detection portion 32 becomes the inherent frequency $\omega_0$ of the alkali metal.

In addition, although not illustrated, the excitation light control portion 61 is provided with a voltage controlled quartz crystal oscillator (oscillation circuit), and outputs an oscillation frequency of the voltage controlled quartz crystal oscillator as an output signal of the atomic oscillator 1 while synchronously adjusting the oscillation frequency on the basis of a detection result from the light detection portion 32.

In addition, the temperature control portion 62 controls a current which flows to the heater 33 on the basis of a detection result from the temperature sensor 34. Thus, the gas cell 31 can be maintained in a desired temperature range.

Further, the magnetic field control portion 63 controls a current which flows to the coil 35 so as to make a magnetic field generated by the coil 35 constant.

Connectors

The connector 71 (first connector) is installed at the first package 22 and has a function of electrically connecting the light emitting portion 21 to the wiring board 5. Consequently, the light emitting portion 21 in the first package 22 is electrically connected to the controller 6 via the connector 71.

The connector 72 (second connector) is installed at the second package 36 and has a function of electrically connecting the light detection portion 32 and the like to the wiring board 5. Consequently, the light detection portion 32, the heater 33, the temperature sensor 34, and the coil 35 in the second package 36 are electrically connected to the controller 6 via the connector 72.

As illustrated in FIG. 4, the connector 71 includes a connector portion 712 which is installed at the first package 22, a fixation portion 713 which is fixed to the wiring board 5, and a cable portion 714 which connects the connector portion 712 to the fixation portion 713.

The connector portion 712 has a sheet shape, and has a plurality of through holes 711 which penetrate in a thickness direction thereof.

The plurality of through holes 711 are provided so as to correspond to the plurality of leads 223 of the first package 22. The plurality of leads 223 are respectively inserted into the plurality of through holes 711 so as to correspond thereto.

The plurality of leads 223 are fixed to the connector portion 712 as illustrated in FIG. 5, for example, via solder, and are electrically connected to wires (not illustrated) provided at the connector portion 712.

On the other hand, the fixation portion 713 has a sheet shape and is fixed to the wiring board 5 as illustrated in FIG. 5, for example, via an anisotropic conductive adhesive (ACF). Wires (not illustrated) provided at the fixation portion 713 are electrically connected to wires (not illustrated) of the wiring board 5.

The wires (not illustrated) of the fixation portion 713 are electrically connected to the wires (not illustrated) of the connector portion 712 via wires (not illustrated) provided at the cable portion 714.

In the same manner as the above-described connector 71, as illustrated in FIG. 4, the connector 72 includes a connector portion 722 which is installed at the second package 36, a fixation portion 723 which is fixed to the wiring board 5, and a cable portion 724 which connects the connector portion 722 to the fixation portion 723.

The connector portion 722 has a sheet shape, and has a plurality of through holes 721 which penetrate in a thickness direction thereof.

The plurality of through holes 721 are provided so as to correspond to the plurality of leads 363 of the second package 36. The plurality of leads 363 are respectively inserted into the plurality of through holes 721 so as to correspond thereto.

The plurality of leads 363 are fixed to the connector portion 722 as illustrated in FIG. 5, for example, via solder, and are electrically connected to wires (not illustrated) provided at the connector portion 722.

On the other hand, the fixation portion 723 has a sheet shape and is fixed to the wiring board 5 as illustrated in FIG. 5, for example, via an anisotropic conductive adhesive (ACF). Wires (not illustrated) provided at the fixation portion 723 are electrically connected to wires (not illustrated) of the wiring board 5.

The wires (not illustrated) of the fixation portion 723 are electrically connected to the wires (not illustrated) of the connector portion 722 via wires (not illustrated) provided at the cable portion 724.

The connectors 71 and 72 are respectively constituted by flexible boards. In other words, in the connector 71, the connector portion 712, the fixation portion 713, and the cable portion 714 are respectively flexible boards, and the connector portion 712, the fixation portion 713, and the cable portion 714 are integrally formed together. Similarly, in the connector 72, the connector portion 722, the fixation portion 723, and the cable portion 724 are respectively flexible boards, and the connector portion 722, the fixation portion 723, and the cable portion 724 are integrally formed together.

The connectors 71 and 72 constituted by the flexible boards are used, and thus it is possible to achieve low cost and miniaturization of the atomic oscillator 1.

The electrical connection between the light emitting portion 21 and the wiring board 5 and the electrical connection between the light detection portion 32 and the like and the wiring board 5 are not limited to the above-described connectors 71 and 72, and may be performed, for example, by using the connector portions having a socket shape.

In the above-described atomic oscillator 1, a gas cell assembly in which the gas cell 31 and the coil 35 are stored in the shield case 9 is provided (mounted) in the second package 36. Hereinafter, a configuration of the gas cell assembly will be described.

First Embodiment

Figure 7:
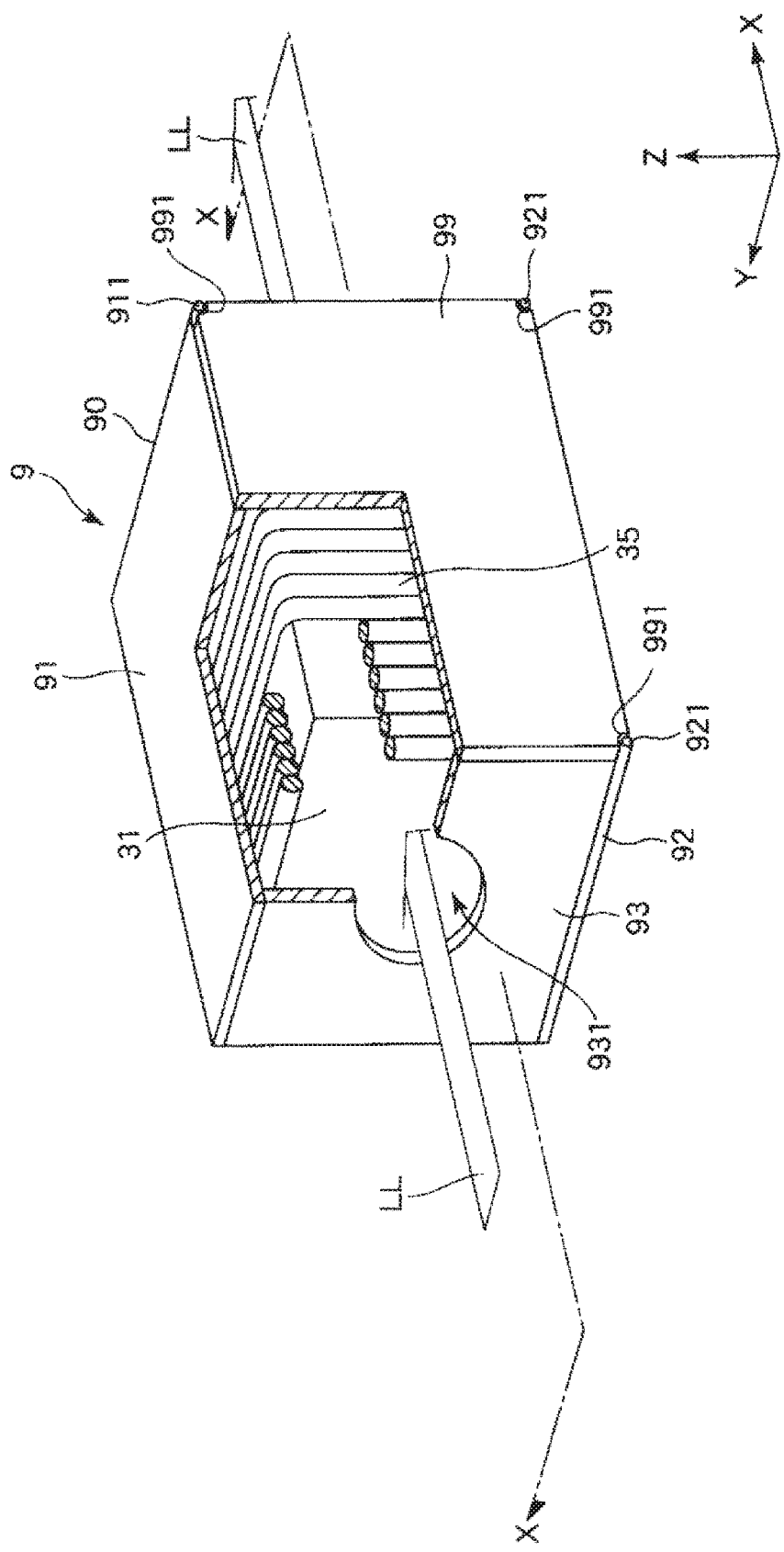
FIG. 7 is a perspective view (partially ruptured view) illustrating a schematic configuration of a gas cell assembly according to a first embodiment.
Figure 8:
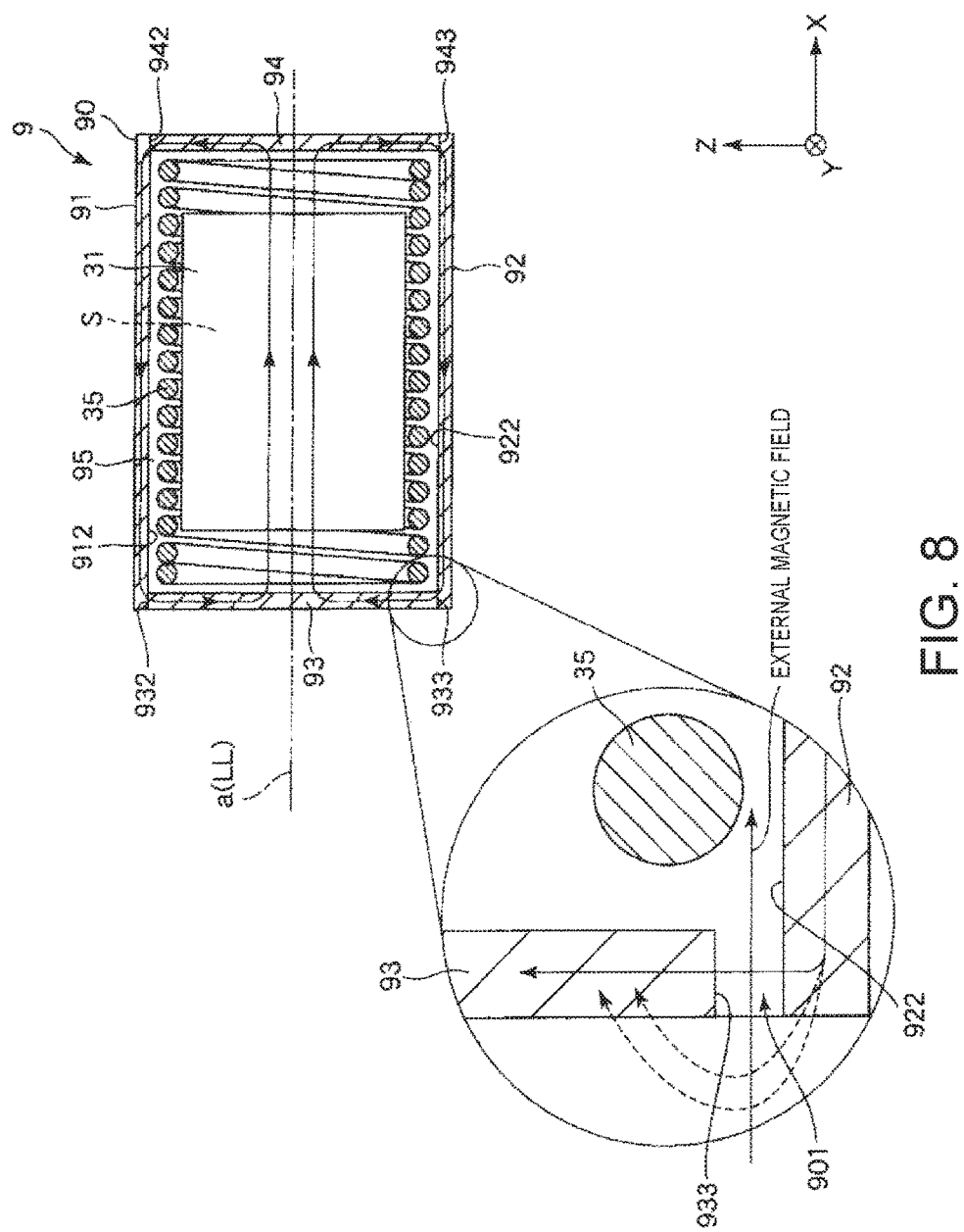
FIG. 8 is a cross-sectional view taken along the line X-X in FIG. 7.
Figure 9:
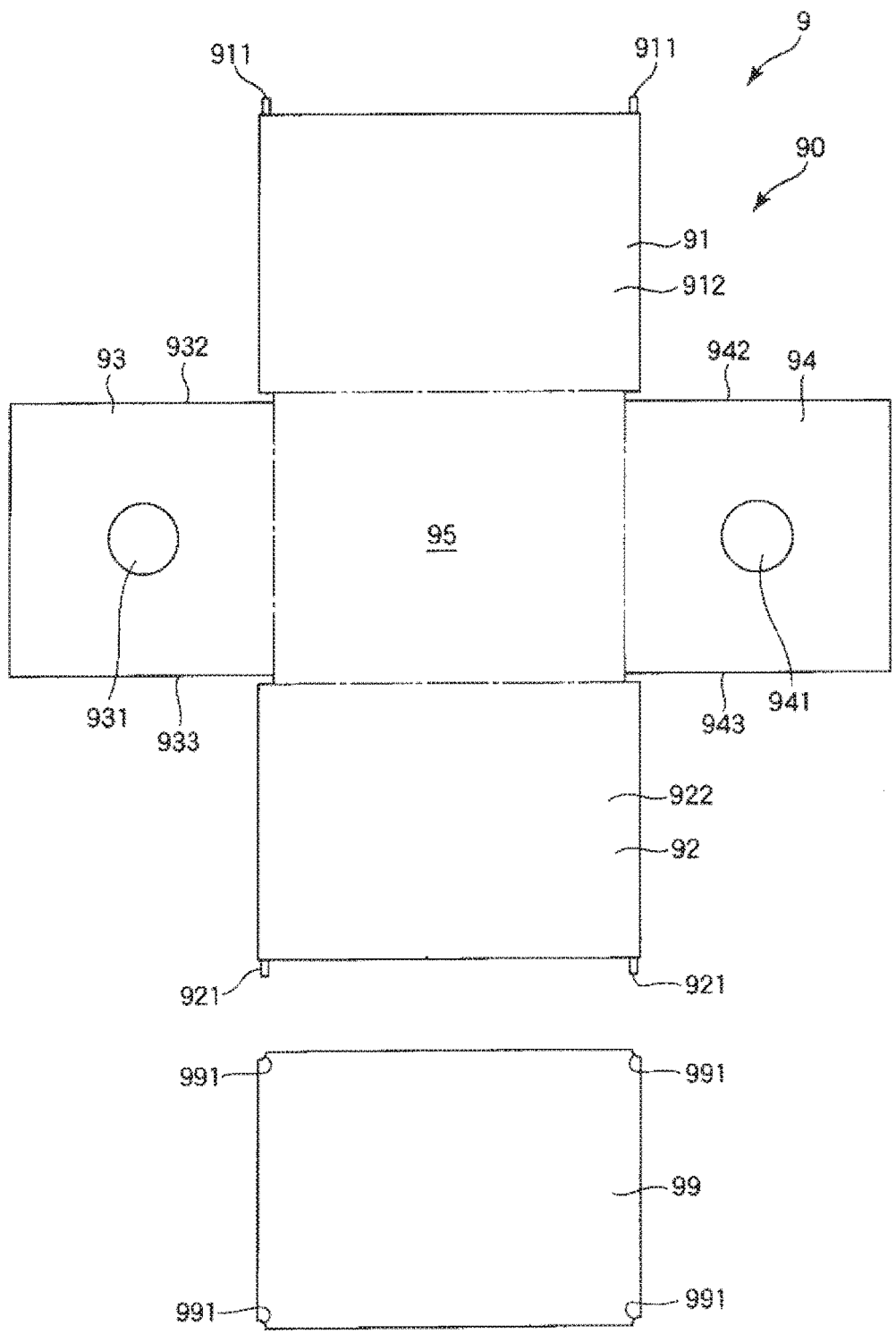
FIG. 9 is a development view of a shield case illustrated in FIG. 7.

FIG. 7 is a perspective view (partially ruptured view) illustrating a schematic configuration of a gas cell assembly according to a first embodiment; FIG. 8 is a cross-sectional view taken along the line X-X in FIG. 7; and FIG. 9 is a development view of a shield case illustrated in FIG. 7. In FIGS. 7 and 8, descriptions will be made assuming that the left side (an incidence side of the excitation light LL) of the drawing is a "front side", the right side (an emission side of the excitation light LL) thereof is a "rear side", the top side thereof is an "upper side", the bottom side thereof is a "lower side", the front side thereof is a "right side", and the depth side thereof is a "left side".

As illustrated in FIG. 7, the gas cell assembly has a configuration in which the square columnar gas cell 31 is inserted into the square tubular coil 35 which is wound, and the coil 35 into which the gas cell 31 is inserted is stored in the shield case 9 containing a metal material. Thus, the coil 35 is provided so as to surround an outer circumference of the gas cell 31 with the axis a (optical axis) of the excitation light LL applied to the gas cell 31 as an axial direction.

The shield case 9 includes a box-shaped main body 90 and a lid 99 (right tabular portion) which covers an opening of the main body 90.

As illustrated in FIGS. 7 and 8, the main body 90 includes an upper tabular portion 91, a lower tabular portion 92, a front tabular portion 93, a rear tabular portion 94, and a left tabular portion 95, and is formed by folding a single plate having the five tabular portions 91 to 95 as illustrated in FIG. 9. The front tabular portion 93 and the rear tabular portion 94 are respectively provided with through holes 931 and 941 through which the excitation light LL passes.

In addition, pins 911 are formed at a front end and a rear end of a side surface of the upper tabular portion 91 on an opposite side to the left tabular portion 95 so as to protrude outward, and pins 921 are formed at a front end and a rear end of a side surface of the lower tabular portion 92 on an opposite side to the left tabular portion 95 so as to protrude outward. On the other hand, notches 991 are respectively formed at four corners of the lid (right tabular portion) 99.

In a state in which the lid 99 is installed at the main body 90 (an assembly state of the shield case 9), the four pins 911 and 921 are fitted to the corresponding notches 991 of the lid 99, and thus the lid 99 is fixed to the main body 90. In addition, in this state, the main body 90 and the lid 99 may be joined to each other by using, for example, adhesion using an adhesive, brazing, seam welding, and energy ray welding (laser welding, electron ray welding, or the like).

In the invention, a main surface of one of two adjacent tabular portions faces a side surface of the other thereof, particularly, the two adjacent tabular portions are located so that the side surface of the other tabular portion is included in a region of the main surface of one tabular portion when viewed from a direction perpendicular to the main surface of one tabular portion.

In the present embodiment, an inner surface (main surface) 912 of the upper tabular portion (one tabular portion) 91 faces an upper surface (side surface) 932 of the front tabular portion (the other tabular portion) 93 and an upper surface (side surface) 942 of the rear tabular portion (the other tabular portion) 94. In addition, an inner surface (main surface) 922 of the lower tabular portion (one tabular portion) 92 faces a lower surface (side surface) 933 of the front tabular portion (the other tabular portion) 93 and a lower surface (side surface) 943 of the rear tabular portion (the other tabular portion) 94.

According to this configuration, since a magnetic field (a magnetic line) generated by the coil 35 can pass through the shield case 9, the magnetic line of the magnetic field in the X axis direction can be made substantially parallel to the axis a of the excitation light LL. Thus, the magnetic field generated by the coil 35 can reliably act on the alkali metal atoms present in the inner space S.

With the configuration, thicknesses of the entire shield case 9 can be made uniform, and thus a shield effect by the shield case 9 can be sufficiently achieved.

As illustrated in FIG. 8, in an enlarged view of the corner of the shield case 9, a gap 901 is formed between, for example, the lower tabular portion 92 and the front tabular portion 93. However, since the gap 901 is present in the X axis direction of the shield case 9, even if an external magnetic field enters the shield case 9 through the gap 901, the external magnetic field only travels substantially in parallel to the inner surface 922 of the lower tabular portion 92 and thus does not directly travel toward the gas cell 31. For this reason, it is possible to prevent the external magnetic field from unnecessarily acting on the alkali metal atoms present in the inner space S.

As mentioned above, in the invention, the shield case 9 having the above-described configuration is used, and thus it is possible to stabilize a magnetic field of the inner space S of the gas cell 31 so as to further reduce a line width of the EIT signal, thereby realizing good frequency stability.

Figure 17:
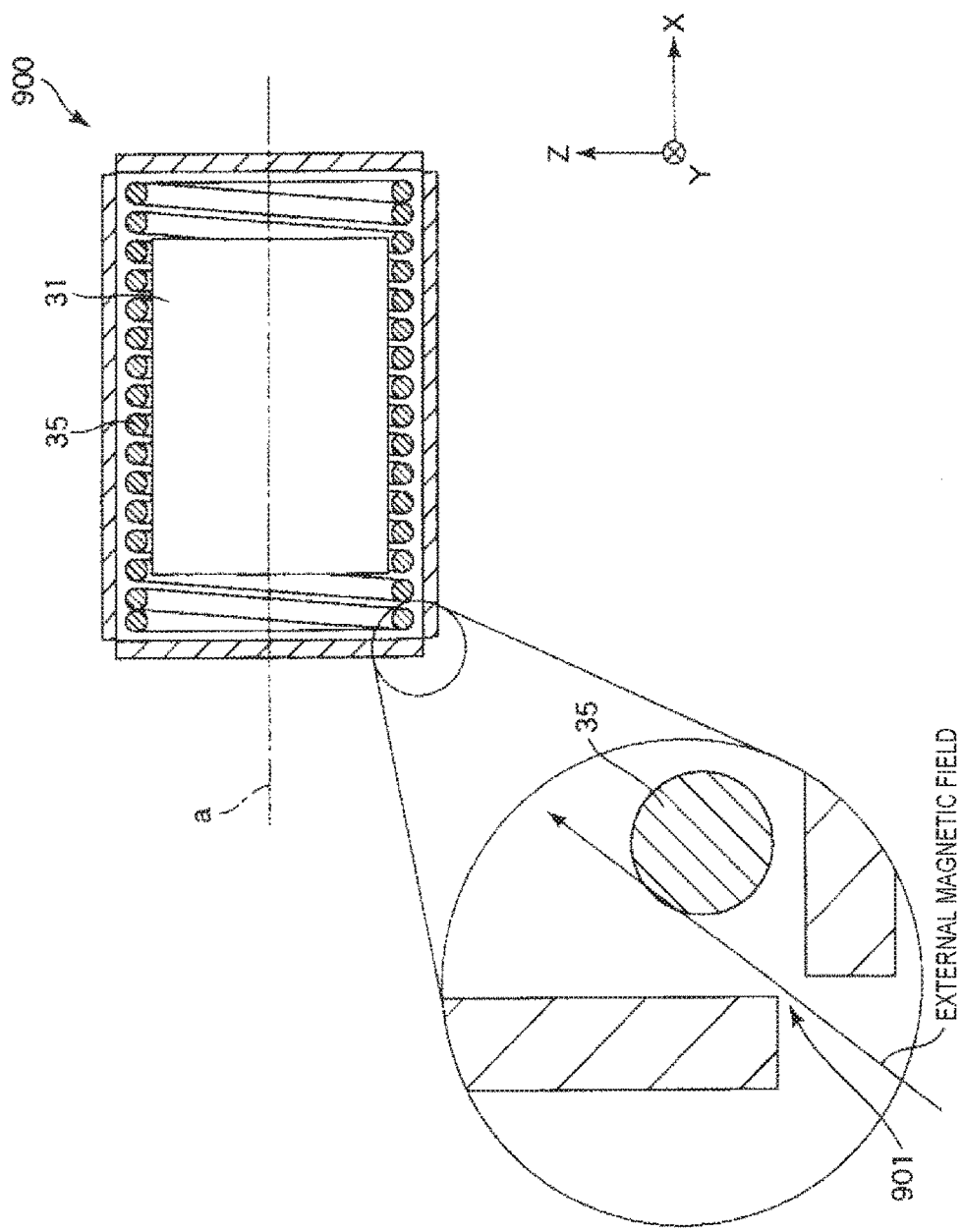
FIG. 17 is a cross-sectional view, corresponding to FIG. 8, of a gas cell assembly in which a shield case of the related art is used.

In contrast, as illustrated in FIG. 17, in a shield case 900 which is formed only by folding a sheet metal, a side surface of one of two adjacent tabular portions does not surely face a side surface of the other thereof at a part (corner) where edges (tabular portions) of the sheet metal are close to or in contact with each other. For this reason, a magnetic field generated by the coil 35 does not smoothly pass through the shield case 900, and it is difficult for the magnetic line of the magnetic field in the X axis direction to be made substantially parallel to the axis a of the excitation light LL.

In this shield case 900, a sufficient thickness cannot be secured at the corner. For this reason, a shield effect by the shield case 900 cannot be sufficiently achieved. In an enlarged view of the corner, a gap 901 is formed thereat, and, if an external magnetic field enters the shield case through the gap, the external magnetic field directly travels toward the gas cell 31 and thus has an adverse effect on the alkali metal atoms present in the inner space S of the gas cell 31.

As mentioned above, even if the shield case 900 of the related art is used, a magnetic field in the inner space S of the gas cell 31 cannot be stabilized, as a result, it is hard to reduce a line width of the EIT signal, and thus it is not possible to realize good frequency stability.

As described above, according to the invention, thicknesses of the entire shield case 9 are made uniform, that is, there is no part where the tabular portions 91 to 95 overlap each other in the shield case 9. This contributes to miniaturization of the shield case 9, and further, to miniaturization of the atomic oscillator 1.

The shield case 9 may contain a metal material; may be made of only a metal material; may be made of a resin material in which particles made of a metal material are dispersed; and may be formed of a laminate including a metal layer made of a metal material and a resin layer made of a resin material.

As the metal material, any metal material may be used as long as the metal material causes the shield case 9 to achieve a sufficient shield effect, but a soft magnetic material is preferably contained. As the soft magnetic material, an alloy containing at least one of iron, nickel, chrome, and cobalt, and, particularly, permalloy is preferably used. The soft magnetic material (particularly, permalloy) is used as a metal material, and thus it is possible to further improve a shield effect by the shield case 9.

An average thickness of the shield case 9 (the main body 90 (the tabular portions 91 to 95) and the lid (the right tabular portion) 99) is not particularly limited, but is preferably about 0.05 mm to 1 mm, and is more preferably about 0.1 mm to 0.7 mm. Consequently, it is possible to achieve a sufficient shield effect and miniaturization of the shield case 9.

Second Embodiment

Next, a gas cell assembly according to a second embodiment will be described.

Figure 10:
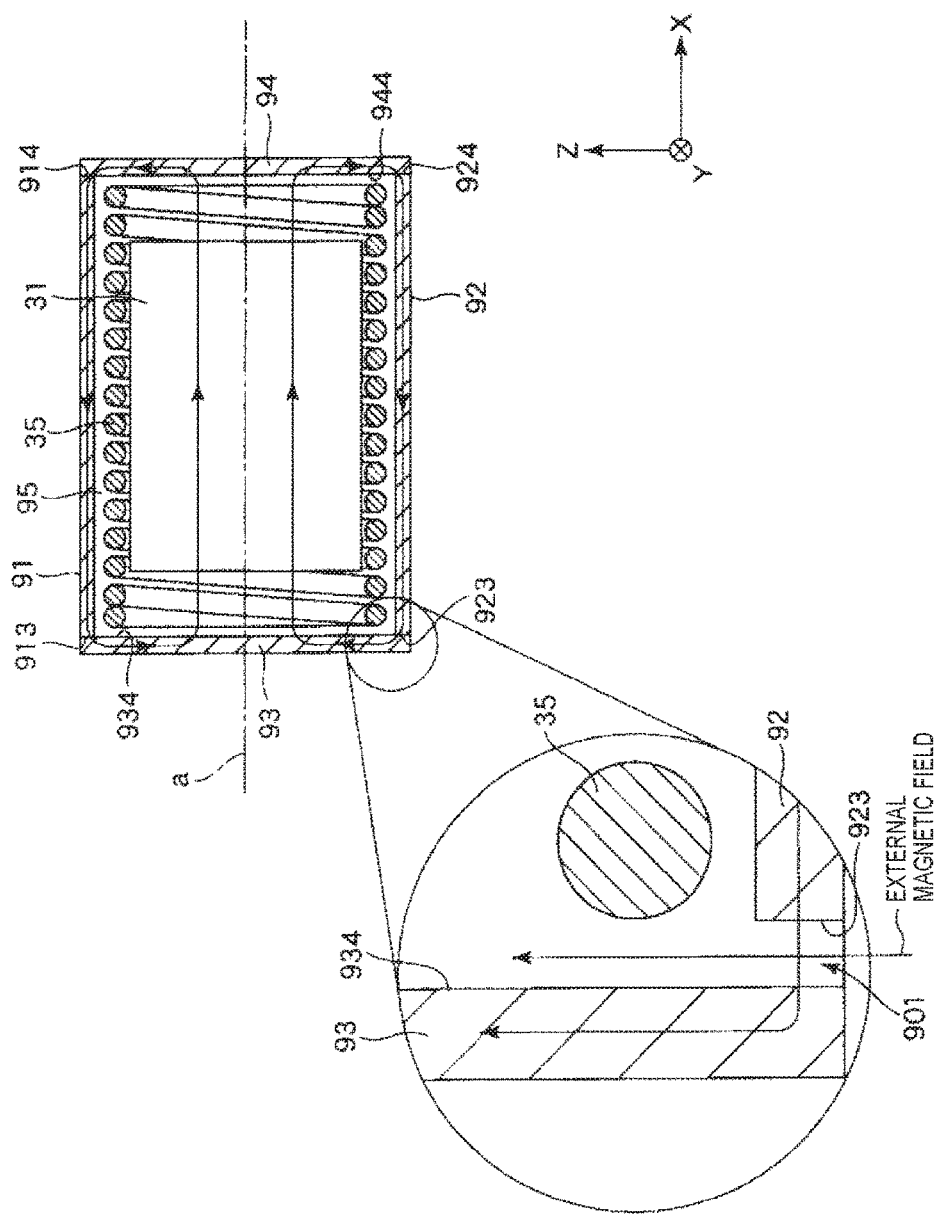
FIG. 10 is a cross-sectional view, corresponding to FIG. 8, of a gas cell assembly according to a second embodiment.

FIG. 10 is a cross-sectional view, corresponding to FIG. 8, of a gas cell assembly according to the second embodiment.

Hereinafter, the second embodiment will be described focusing on differences from the first embodiment, and description of the same content will be omitted. In FIG. 10, the same constituent elements as in the first embodiment are given the same reference numerals.

The second embodiment is the same as the first embodiment except that a positional relationship between the upper tabular portion 91 and the lower tabular portion 92, and between the front tabular portion 93 and the rear tabular portion 94 are different.

In the second embodiment, the inner surface (main surface) 934 of the front tabular portion (one tabular portion) 93 faces the front surface (side surface) 913 of the upper tabular portion (the other tabular portion) 91 and the front surface (side surface) 923 of the lower tabular portion (the other tabular portion) 92. In addition, the inner surface (main surface) 944 of the rear tabular portion (one tabular portion) 94 faces the rear surface (side surface) 914 of the upper tabular portion (the other tabular portion) 91 and the rear surface (side surface) 924 of the lower tabular portion (the other tabular portion) 92.

In other words, the front tabular portion 93 is disposed so that the inner surface 934 facing the front surfaces 913 and 923 of the upper tabular portion 91 and the lower tabular portion 92 intersects the axial direction (the axis a of the excitation light LL) of the coil 35. In addition, the rear tabular portion 94 is disposed so that the inner surface 944 facing the rear surfaces 914 and 924 of the upper tabular portion 91 and the lower tabular portion 92 intersects the axial direction of the coil 35.

It is possible to achieve the same operations and effects as in the shield case 9 of the first embodiment by using the shield case 9 of the second embodiment as well.

From the viewpoint of further reducing a line width of the EIT signal, a magnetic field (a loop of a magnetic line) is preferably further extended in the X axis direction than in the Y axis direction and the Z axis direction. Here, the gap 901 is formed in the X axis direction at the corner of the shield case 9 of the first embodiment. For this reason, if a magnetic field is further extended in the X axis direction than in the Y axis direction and the Z axis direction, most of magnetic fields pass through the shield case 9, but, as illustrated in FIG. 8, there is a case where some of the magnetic fields may leak out of the shield case 9 through the gap 9, and thus disturbance may occur in the magnetic fields.

In contrast, in the shield case 9 of the second embodiment, since the gap 901 is formed in the Z axis direction, even if the magnetic fields are in the above-described state, the magnetic fields do not leak out of the shield case 9 through the gap 901, or, even if leakage occurs, a leakage amount thereof is extremely smaller than in the first embodiment. Therefore, according to the shield case 9 of the second embodiment, it is possible to stabilize a magnetic field in the inner space S of the gas cell 31 more than in the shield case 9 of the first embodiment, so as to further reduce a line width of the EIT signal, thereby realizing better frequency stability.

In relation to an external magnetic field, in the same manner as in the first embodiment, even if the external magnetic field enters the shield case 9 through the gap 901, the external magnetic field only travels substantially in parallel to the inner surface 934 of the lower tabular portion 93 and thus does not directly travel toward the gas cell 31. For this reason, it is possible to prevent the external magnetic field from unnecessarily acting on the alkali metal atoms present in the inner space S.

Third Embodiment

Next, a gas cell assembly according to a third embodiment will be described.

Figure 11:
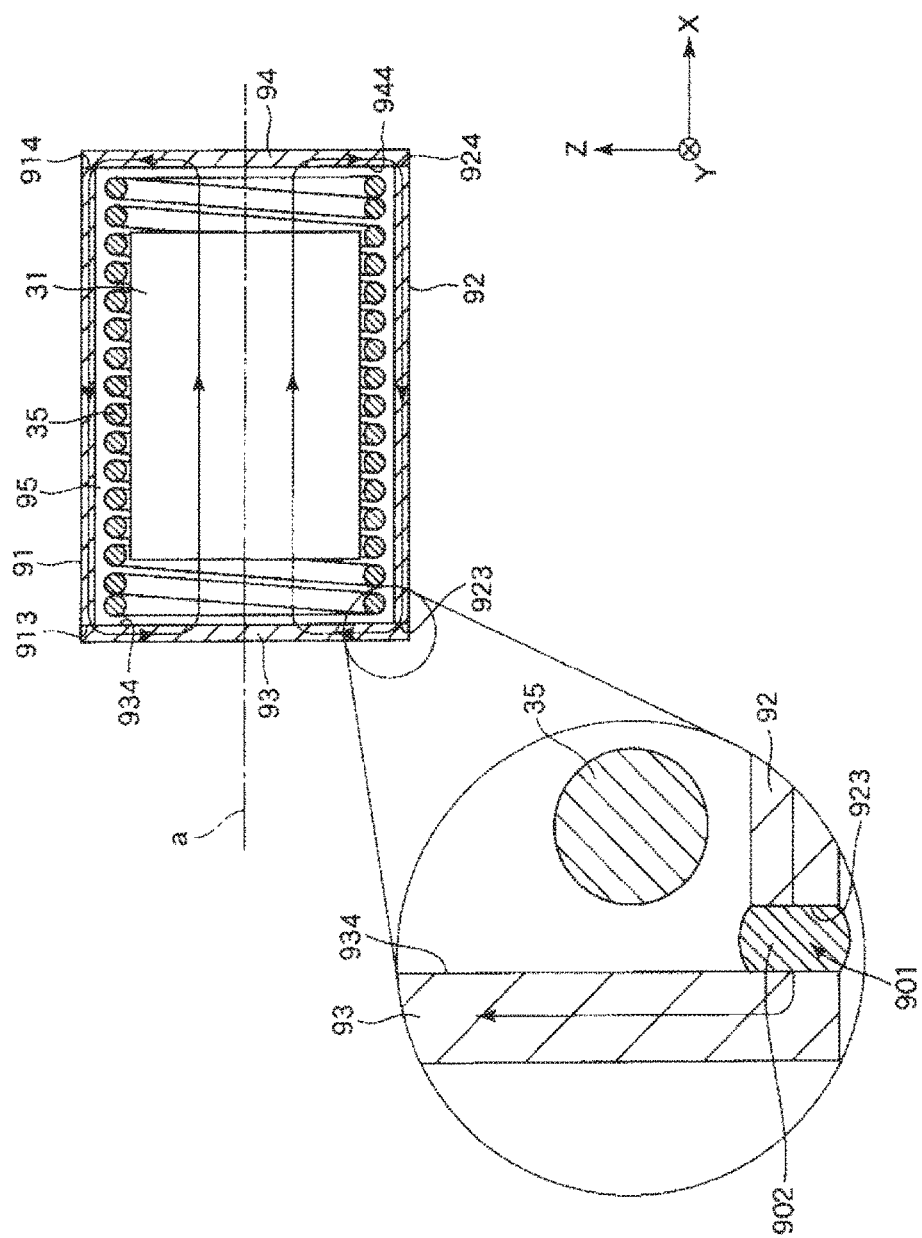
FIG. 11 is a cross-sectional view, corresponding to FIG. 8, of a gas cell assembly according to a third embodiment.

FIG. 11 is a cross-sectional view, corresponding to FIG. 8, of a gas cell assembly according to the third embodiment.

Hereinafter, the third embodiment will be described focusing on differences from the first and second embodiments, and description of the same content will be omitted. In FIG. 11, the same constituent elements as in the first and second embodiments are given the same reference numerals.

The third embodiment is the same as the second embodiment except that two adjacent tabular portions are joined to each other at a part where a main surface and a side surface face each other. Specifically, the upper tabular portion 91 and the lower tabular portion 92 are joined to the front tabular portion 93 and the rear tabular portion 94 via a joint portion 902. In other words, the gap 901 is filled with the joint portion 902.

It is possible to achieve the same operations and effects as in the shield case 9 of the first and second embodiments by using the shield case 9 of the third embodiment as well.

The tabular portions 91 to 94 are joined to each other via the joint portion 902, and thus it is possible to improve a mechanical strength of the shield case 9. According to the configuration, it is possible to reliably prevent a size of the gap 901 from changing and also for the joint portion 902 to prevent an external magnetic field from entering the shield case 9 through the gap 901. As a result, a magnetic field in the inner space S of the gas cell 31 can be more reliably stabilized.

The joint portion 902 may be formed by using, for example, adhesion using an adhesive, brazing, seam welding, and energy ray welding (laser welding, electron ray welding, or the like). In addition, the joint portion 902 is preferably formed by using the same material as that of the shield case 9.

The tabular portions 91 to 94 of the first embodiment may be joined to each other via the joint portion 902.

Fourth Embodiment

Next, a gas cell assembly according to a fourth embodiment will be described.

Figure 12:
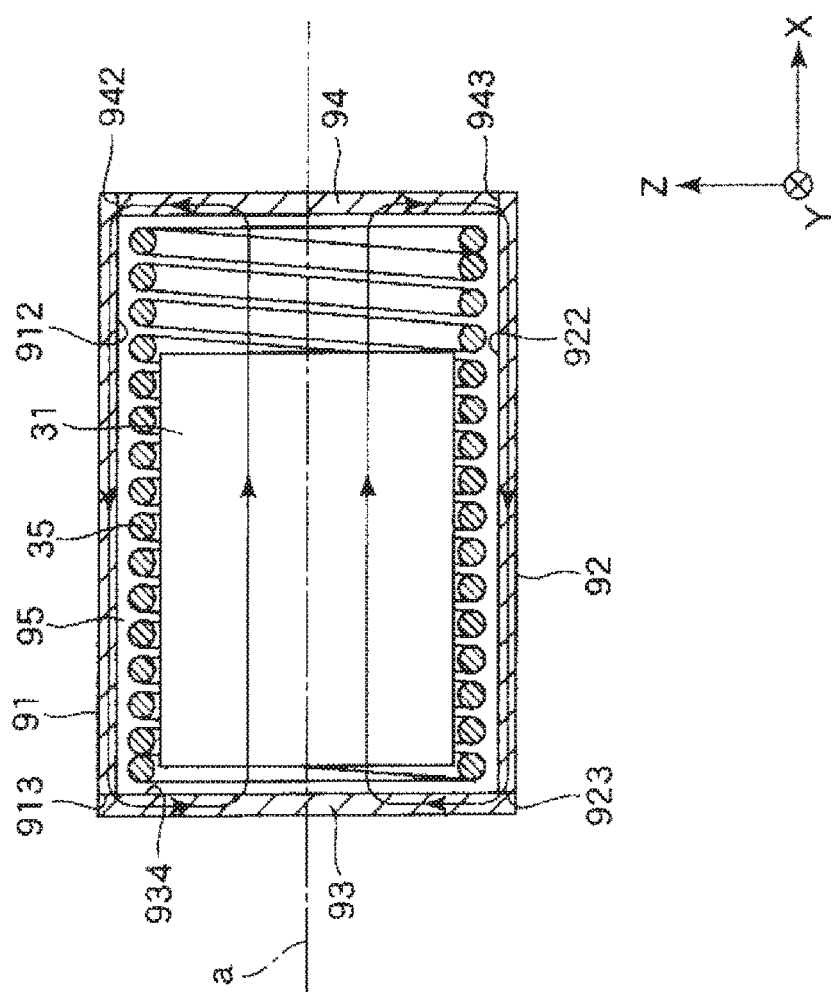
FIG. 12 is a cross-sectional view, corresponding to FIG. 8, of a gas cell assembly according to a fourth embodiment.

FIG. 12 is a cross-sectional view, corresponding to FIG. 8, of a gas cell assembly according to the fourth embodiment.

Hereinafter, the fourth embodiment will be described focusing on differences from the first and second embodiments, and description of the same content will be omitted. In FIG. 12, the same constituent elements as in the first and second embodiments are given the same reference numerals.

In the fourth embodiment, a positional relationship between the front tabular portion 93, and the upper tabular portion 91 and the lower tabular portion 92 is the same as in the second embodiment, and a positional relationship between the rear tabular portion 94, and the upper tabular portion 91 and the lower tabular portion 92 is the same as in the first embodiment.

It is possible to achieve the same operations and effects as in the shield case 9 of the first to third embodiments by using the shield case 9 of the fourth embodiment as well.

In the fourth embodiment, as illustrated in FIG. 12, the gas cell 31 is preferably disposed to be shifted toward (biased toward) the front tabular portion 93 side which allows a magnetic field to be easily stabilized. Consequently, it is possible to prevent or minimize an instable state of a magnetic field in the inner space S of the gas cell 31.

Fifth Embodiment

Next, a gas cell assembly according to a fifth embodiment will be described.

Figure 13:
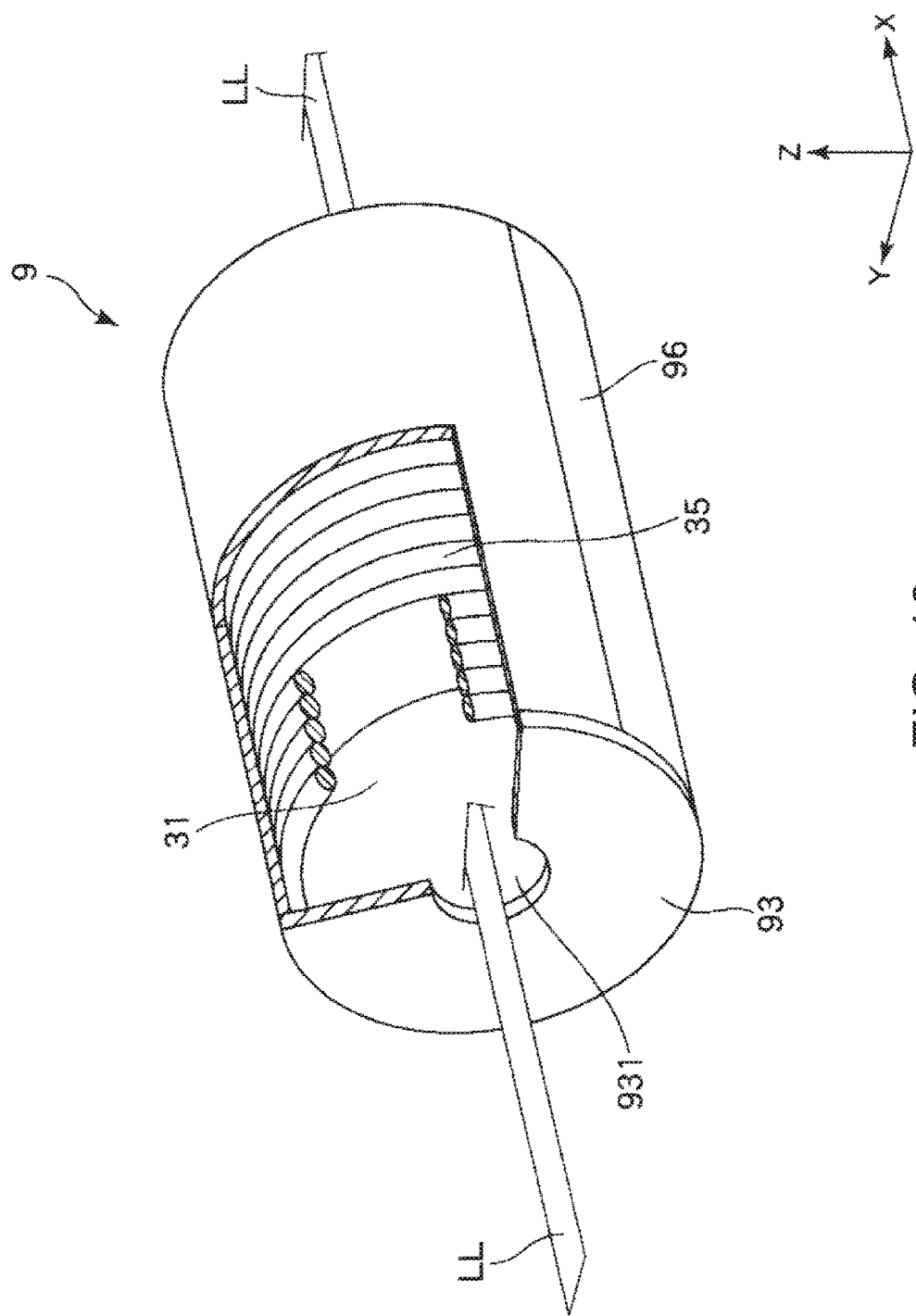
FIG. 13 is a perspective view (partially ruptured view) illustrating a schematic configuration of a gas cell assembly according to a fifth embodiment.
Figure 14:
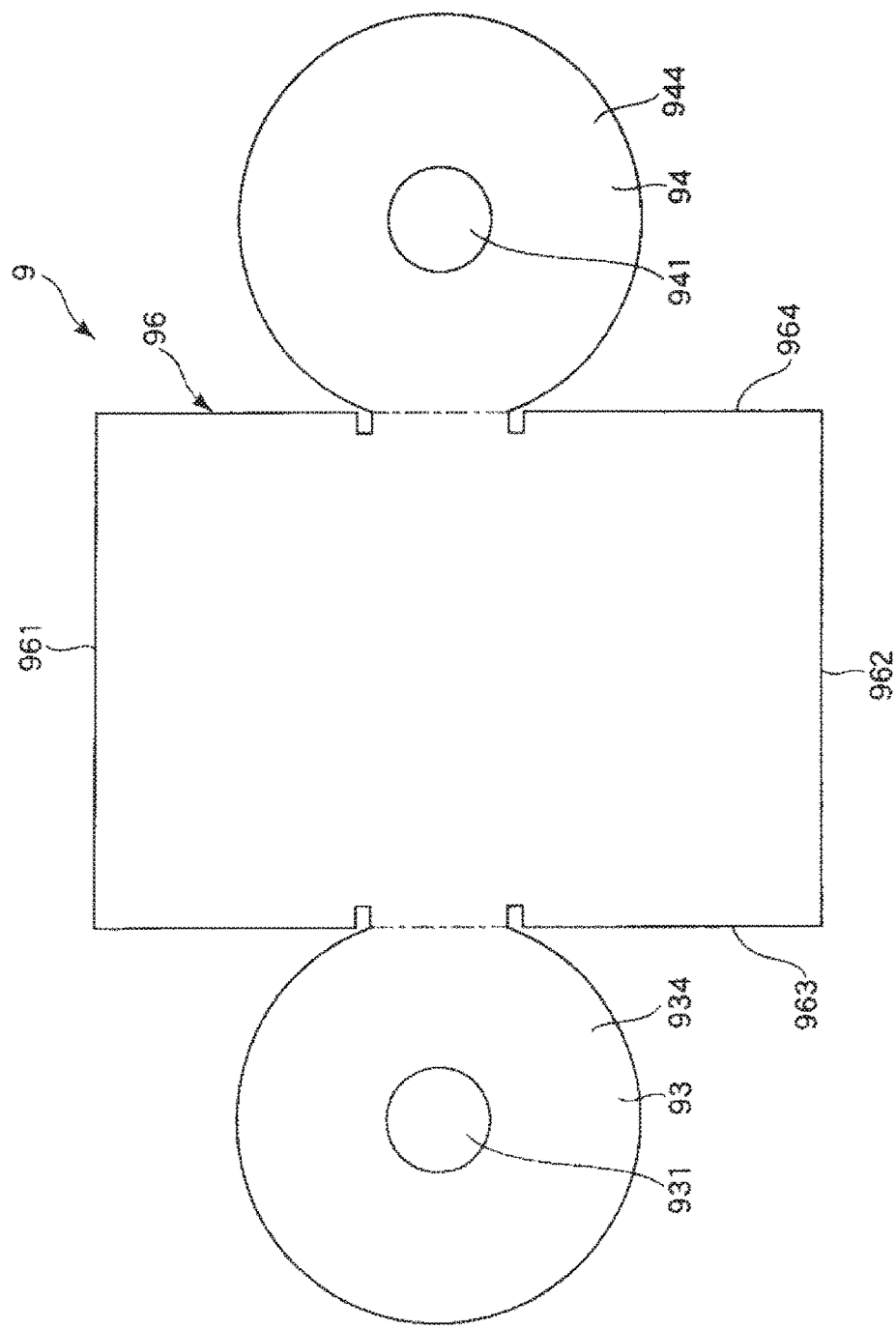
FIG. 14 is a development view of a shield case illustrated in FIG. 13.

FIG. 13 is a perspective view (partially ruptured view) illustrating a schematic configuration of a gas cell assembly according to the fifth embodiment, and FIG. 14 is a development view of a shield case illustrated in FIG. 13. In FIG. 13, a description will be made assuming that the left side (an incidence side of the excitation light LL) of the drawing is a "front side", the right side (an emission side of the excitation light LL) thereof is a "rear side", the top side thereof is an "upper side", the bottom side thereof is a "lower side", the front side thereof is a "right side", and the depth side thereof is a "left side".

Hereinafter, the fifth embodiment will be described focusing on differences from the first and second embodiments, and description of the same content will be omitted. In FIGS. 13 and 14, the same constituent elements as in the first and second embodiments are given the same reference numerals.

The fifth embodiment is the same as the first embodiment except for a difference in the entire shape of the gas cell assembly.

As illustrated in FIG. 13, the gas cell assembly has a configuration in which the columnar gas cell 31 is inserted into the cylindrical coil 35 which is wound, and the coil 35 into which the gas cell 31 is inserted is stored in the shield case 9 containing a metal material. Thus, the coil 35 is provided so as to surround an outer circumference of the gas cell 31 with the axis a (optical axis) of the excitation light LL applied to the gas cell 31 as an axial direction.

The shield case 9 includes a cylindrical body portion (tabular portion) 96, a disc-shaped front tabular portion 93 which is provided to cover a front opening of the body portion 96, and a disc-shaped rear tabular portion 94 which is provided to cover a rear opening of the body portion 96.

As illustrated in FIG. 14, the shield case 9 is formed by folding a single plate having the three tabular portions 93, 94 and 96.

The body portion 96 is formed by bending a rectangular region of a single plate in a cylindrical shape, and further by joining an upper surface 961 to a lower surface 962. This joining may be performed by using, for example, brazing, seam welding, and energy ray welding (laser welding, electron ray welding, or the like). A joint member for joining the upper surface 961 and the lower 962 together may be interposed therebetween.

In the present embodiment, an inner surface (main surface) 934 of the front tabular portion (one tabular portion) 93 faces a front surface (side surface) 963 of the body portion (the other tabular portion) 96, and an inner surface (main surface) 944 of the rear tabular portion (one tabular portion) 94 faces a rear surface (side surface) 964 of the body portion (the other tabular portion) 96.

It is possible to achieve the same operations and effects as in the shield case 9 of the first to fourth embodiments by using the shield case 9 of the fifth embodiment as well.

The tabular portions 93, 94 and 96 may be joined to each other via the joint portion 902 of the third embodiment.

In the above-described gas cell assembly, the gas cell 31 and the coil 35 are provided in the shield case 9, but at least one of the light detection portion 32, the heater 33, and the temperature sensor 34 may be provided therein, and all the constituent elements may be provided therein. In a case where all of the gas cell 31, the light detection portion 32, the heater 33, the temperature sensor 34, and the coil 35 are provided, the second package 36 may be used as a shield case.

In the first to fourth embodiments, the main body 90 (the tabular portions 91 to 95) and the lid (right tabular portion) 99 may be integrally formed together, that is, the shield case 9 may be formed by folding a single plate having the main body 90 (the tabular portions 91 to 95) and the lid (right tabular portion) 99.

2. Electronic Apparatus

The atomic oscillator as described above may be incorporated into various electronic apparatuses. These electronic apparatuses have high reliability.

Hereinafter, an electronic apparatus according to an embodiment of the invention will be described.

Figure 15:
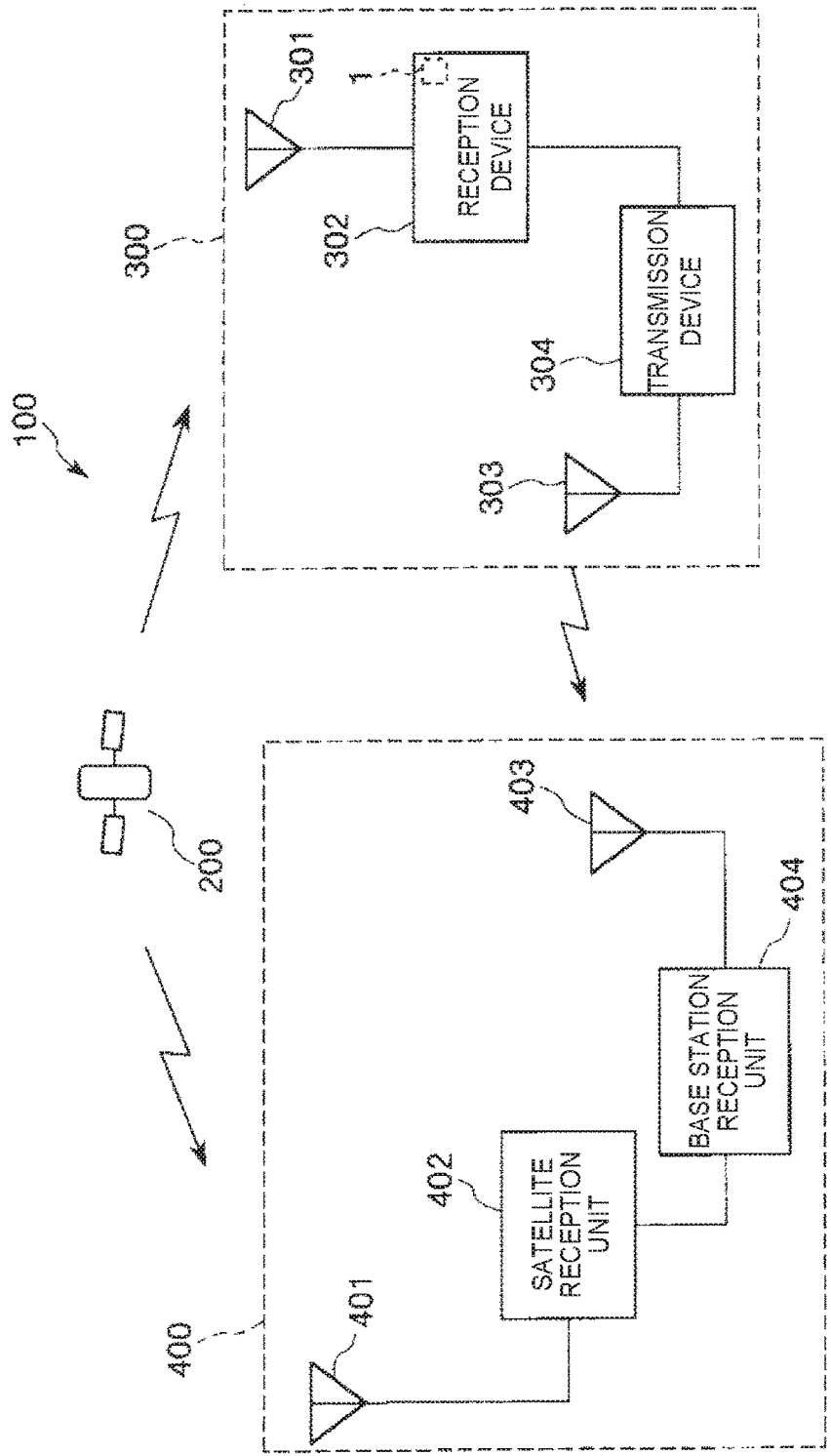
FIG. 15 is a diagram illustrating a schematic system configuration in a case where the atomic oscillator according to the embodiments of the invention is applied to a positioning system using a GPS satellite.

FIG. 15 is a diagram illustrating a schematic system configuration in a case where the atomic oscillator according to the embodiments of the invention is applied to a positioning system using a GPS satellite.

A positioning system 100 illustrated in FIG. 15 includes a GPS satellite 200, a base station apparatus 300, and a GPS reception apparatus 400.

The GPS satellite 200 transmits positioning information (GPS signal).

The base station apparatus 300 includes, for example, a reception device 302 which receives the positioning information from the GPS satellite 200 via an antenna 301 which is installed at an electronic reference point (GPS Observation Network of Geographical Survey Institute), and a transmission device 304 which transmits the positioning information received by the reception device 302 via an antenna 303.

Here, the reception device 302 is an electronic apparatus which includes the atomic oscillator 1 according to the embodiment of the invention as a reference frequency oscillation source. The reception device 302 has high reliability. In addition, the positioning information received by the reception device 302 is transmitted by the transmission device 304 in real time.

The GPS reception apparatus 400 includes a satellite reception unit 402 which receives the positioning information from the GPS satellite 200 via an antenna 401, and a base station reception unit 404 which receives the positioning information from the base station apparatus 300 via an antenna 403.

3. Moving Object

Figure 16:
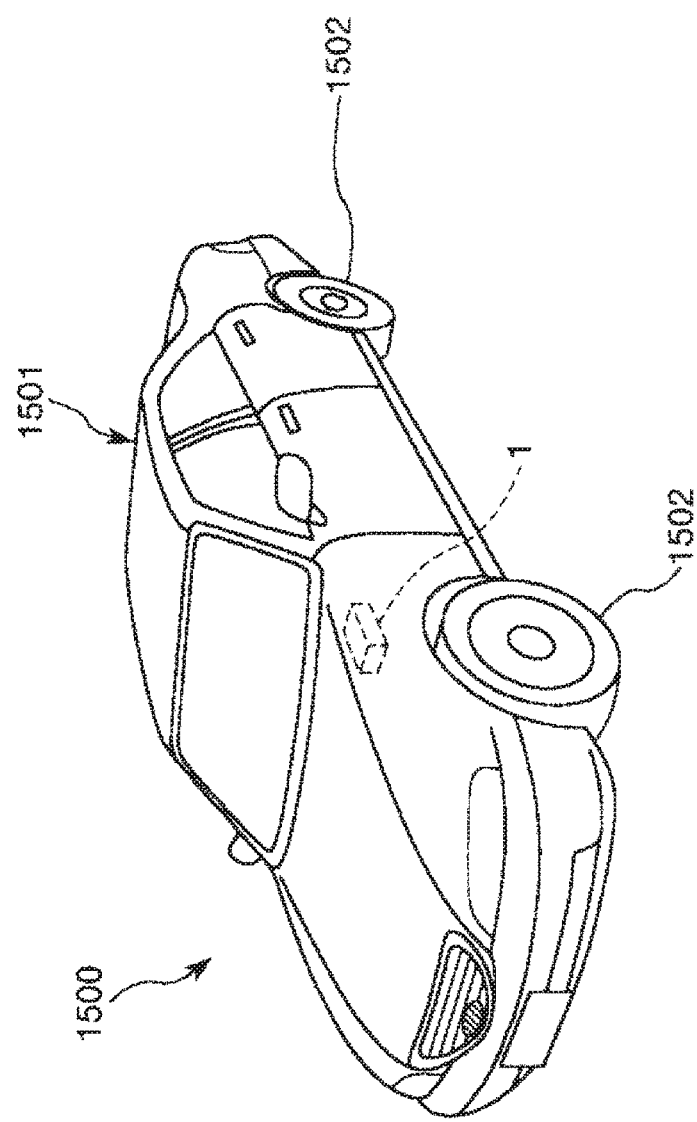
FIG. 16 is a diagram illustrating an example of a moving object according to an embodiment of the invention.

FIG. 16 is a diagram illustrating an example of a moving object according to an embodiment of the invention.

In FIG. 16, a moving object 1500 has a car body 1501 and four wheels 1502, and the wheels 1502 are rotated by a power source (engine) provided in the car body 1501. The atomic oscillator 1 is built into the moving object 1500.

Such a moving object has high reliability.

In addition, electronic apparatuses having the atomic oscillator (the quantum interference device according to the embodiments of the invention) according to the embodiment of the invention are not limited thereto, and may be applied to, for example, a mobile phone, a digital still camera, an ink jet type ejection apparatus (for example, an ink jet printer), a personal computer (a mobile type personal computer or a laptop type personal computer), a television, a video camera, a video tape recorder, a car navigation apparatus, a pager, an electronic organizer (including a communication function), an electronic dictionary, an electronic calculator, an electronic gaming machine, a wordprocessor, a workstation, a videophone, a security television monitor, an electronic binocular, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), a flight simulator, a terrestrial digital broadcast, and a mobile phone base station.

As mentioned above, the quantum interference device, the atomic oscillator, the electronic apparatus, and the moving object according to the embodiments of the invention have been described with reference to the drawings, but the invention is not limited thereto.

In the quantum interference device, the atomic oscillator, the electronic apparatus, and the moving object according to the embodiments of the invention, a configuration of each part according to the embodiments of the invention may be replaced with any configuration showing the same function as in the above-described embodiments, and any configuration may be added thereto.

The atomic oscillator according to the embodiments of the invention may cover a combination of arbitrary configurations of the respective embodiments.

For example, in the above-described embodiments, a structure in which the gas cell is disposed between the light emitting portion and the light detection portion has been described as an example, but the light emitting portion and the light detection portion may be disposed on the same side as the gas cell, and light reflected at a surface of the gas cell on an opposite side to the light emitting portion and the light detection portion or a mirror which is provided at the gas cell on an opposite side to the light emitting portion and the light detection portion may be detected by the light detection portion.

In the above-described embodiments, a case where the first package, the second package, and the optical components are respectively engaged with the through holes formed at the wiring board has been described as an example, but the invention is not limited thereto. For example, the first package, the second package, and the optical components may be disposed on one surface of the wiring board, and the first package, the second package, and the optical components may be held by a box-shaped or block-shaped holder, and the holder may be disposed on the wiring board.

For example, the components stored in the first package and the components and the optical components stored in the second package may be stored in a single package. Consequently, it is possible to further miniaturize the atomic oscillator.

The quantum interference device according to the embodiments of the invention may be applied to an atomic oscillator based on a method of using a double resonance phenomenon caused by light and microwaves.

What is claimed is:

1. A quantum interference device comprising:
   a gas cell into which metal atoms are sealed;
   a light emitting portion that emits light including a pair of resonance light beams for resonating the metal atoms toward the metal atoms;
   a coil that is provided to surround an outer circumference of the gas cell; and
   a shield case that stores the gas cell and the coil and contains a metal material,
   wherein the shield case is constituted by a plurality of tabular portions,
   in the plurality of tabular portions, a first bottom length of each of first and second sides of the bottom surface respectively connecting to the first and second side surfaces is shorter than a first side length of each side of the first and second side surfaces respectively connecting to the first and second sides of the bottom surface,
   in the plurality of tabular portions, a second bottom length of each of third and fourth sides of the bottom surface respectively connecting to the third and fourth side surfaces is longer than a second side length of each side of the third and fourth side surfaces respectively connecting to the third and fourth side of the bottom surface, and
   other two sides configuring the second side length of each of the third and fourth side surfaces respectively face edges of each main surface of the first and second side surfaces.

2. The quantum interference device according to claim 1, wherein the main surface intersects an axial direction of the coil.

3. The quantum interference device according to claim 1, wherein the metal material includes a soft magnetic material.

4. The quantum interference device according to claim 3, wherein the soft magnetic material is permalloy.

5. An atomic oscillator comprising the quantum interference device according to claim 1.

6. An electronic apparatus comprising the quantum interference device according to claim 1.

7. A moving object comprising the quantum interference device according to claim 1.

8. A quantum interference device comprising:
a gas cell into which metal atoms are sealed;
a light emitting portion that emits light including a pair of resonance light beams for resonating the metal atoms toward the metal atoms;
a coil that is provided to surround an outer circumference of the gas cell; and
a shield case that stores the gas cell and the coil, the shield case being made of a metal material, the shield case having top, bottom, and first through fourth side surfaces,
wherein the shield case is constituted by a plurality of tabular portions, each of the plurality of tabular portions has front and back tabular main surfaces and first through fourth tabular side surfaces, and
among the plurality of tabular portions, the front tabular main surface of one of two adjacent tabular portions directly faces an entire of one of the first through fourth tabular side surfaces of the other tabular portion.

9. The quantum interference device according to claim 8, wherein
the front tabular main surface of the one of the two adjacent tabular portions intersects an axial direction of the coil.

10. The quantum interference device according to claim 8, wherein
the metal material includes a soft magnetic material.

11. The quantum interference device according to claim 10, wherein
the soft magnetic material is permalloy.

12. An atomic oscillator comprising the quantum interference device according to claim 8.

13. An electronic apparatus comprising the quantum interference device according to claim 8.

14. A moving object comprising the quantum interference device according to claim 8.

15. A quantum interference device comprising:
a gas cell into which metal atoms are sealed;
a light emitting portion that emits light including a pair of resonance light beams for resonating the metal atoms toward the metal atoms;
a coil that is provided to surround an outer circumference of the gas cell; and
a shield case that stores the gas cell and the coil, the shield case being made of a metal material, the shield case having top, bottom, and first through fourth side surfaces,
wherein the shield case is constituted by a plurality of tabular portions, each of the plurality of tabular portions has front and back tabular main surfaces and first through fourth tabular side surfaces,
among the plurality of tabular portions, the front tabular main surface of one of two adjacent tabular portions directly faces an entire of one of the first through fourth tabular side surfaces of the other tabular portion, and
the front tabular main surface of the one of the two adjacent tabular portions intersects an axial direction of the light.

16. The quantum interference device according to claim 15, wherein
the front tabular main surface of the one of the two adjacent tabular portions intersects an axial direction of the coil.

17. The quantum interference device according to claim 15, wherein
the metal material includes a soft magnetic material.

18. The quantum interference device according to claim 17, wherein
the soft magnetic material is permalloy.

19. An atomic oscillator comprising the quantum interference device according to claim 15.

20. An electronic apparatus comprising the quantum interference device according to claim 15.

21. A moving object comprising the quantum interference device according to claim 15.

* * * * *